US011246230B2

(12) United States Patent
Haba et al.

(10) Patent No.: US 11,246,230 B2
(45) Date of Patent: Feb. 8, 2022

(54) CONFIGURABLE SMART OBJECT SYSTEM WITH METHODS OF MAKING MODULES AND CONTACTORS

(71) Applicant: Xcelsis Corporation, San Jose, CA (US)

(72) Inventors: Belgacem Haba, Saratoga, CA (US); Ilyas Mohammed, Santa Clara, CA (US); Gabriel Z. Guevara, Gilroy, CA (US); Min Tao, San Jose, CA (US)

(73) Assignee: Xcelsis Corporation, San Jose, CA (US)

( * ) Notice: Subject to any disclaimer, the term of this patent is extended or adjusted under 35 U.S.C. 154(b) by 0 days.

(21) Appl. No.: 16/143,055

(22) Filed: Sep. 26, 2018

(65) Prior Publication Data

US 2019/0029132 A1 Jan. 24, 2019

Related U.S. Application Data

(63) Continuation-in-part of application No. 15/396,267, filed on Dec. 30, 2016.
(Continued)

(51) Int. Cl.
*H05K 1/18* (2006.01)
*G06N 3/04* (2006.01)
(Continued)

(52) U.S. Cl.
CPC ......... *H05K 5/0065* (2013.01); *G06N 3/0481* (2013.01); *G06N 3/063* (2013.01);
(Continued)

(58) Field of Classification Search
CPC .... H05K 5/0065; H05K 5/0021; H05K 5/065; H05K 7/1444; H05K 1/028; H05K 1/14;
(Continued)

(56) References Cited

U.S. PATENT DOCUMENTS

| 4,397,705 A * | 8/1983 | Eckert ................... B29C 53/066 156/242 |
| 6,600,222 B1 * | 7/2003 | Levardo .............. H01L 23/5387 257/685 |

(Continued)

FOREIGN PATENT DOCUMENTS

| CN | 103400813 A | * | 11/2013 |
| EP | 17153679 | * | 1/2017 |

OTHER PUBLICATIONS

Teig, U.S. Appl. No. 15/224,632, titled "Mitigating overfitting in training machine trained networks" filed Jul. 31, 2016, 37 pages.
(Continued)

*Primary Examiner* — Timor Karimy
(74) *Attorney, Agent, or Firm* — Lee & Hayes, P.C.

(57) ABSTRACT

Configurable smart object systems with methods of making modules and contactors are provided. Example systems implement machine learning based on neural networks that draw low power for use in smart phones, watches, drones, automobiles, and medical devices. Example assemblies can be configured from pluggable, interchangeable modules that have compatible ports for interconnecting and integrating functionally dissimilar sensor systems. An example method includes mounting an element of a configurable machine learning assembly on a substrate, creating at least one fold in the substrate, folding the substrate at the fold into a housing of a module of the configurable machine learning assembly, and adding a molding material to the housing to at least partially fill the module of the configurable machine learning assembly. The example module construction may also form contactors on folded edges of the module for making physical and electrical contact with other modules of the smart object machine learning assembly.

12 Claims, 28 Drawing Sheets

Related U.S. Application Data

(60) Provisional application No. 62/563,500, filed on Sep. 26, 2017, provisional application No. 62/365,253, filed on Jul. 21, 2016.

(51) Int. Cl.

| | |
|---|---|
| *H05K 5/00* | (2006.01) |
| *H05K 3/30* | (2006.01) |
| *H05K 1/02* | (2006.01) |
| *H05K 5/06* | (2006.01) |
| *G06N 3/08* | (2006.01) |
| *G06N 3/063* | (2006.01) |
| *H05K 7/14* | (2006.01) |
| *H05K 1/14* | (2006.01) |
| *H05K 3/28* | (2006.01) |

(52) U.S. Cl.
CPC ............ *G06N 3/08* (2013.01); *H05K 1/028* (2013.01); *H05K 1/14* (2013.01); *H05K 1/189* (2013.01); *H05K 3/303* (2013.01); *H05K 5/0021* (2013.01); *H05K 5/065* (2013.01); *H05K 7/1444* (2013.01); *H05K 1/0278* (2013.01); *H05K 3/284* (2013.01); *H05K 2201/047* (2013.01); *H05K 2201/10053* (2013.01); *H05K 2201/10151* (2013.01); *H05K 2201/10522* (2013.01); *H05K 2203/1316* (2013.01); *H05K 2203/1327* (2013.01)

(58) Field of Classification Search
CPC ...... H05K 1/189; H05K 1/0278; H05K 3/303; H05K 3/284; H05K 2201/047; H05K 2201/10053; H05K 2201/10151; H05K 2201/10522; H05K 2203/1316; H05K 2203/1327; G06N 3/0481; G06N 3/063; G06N 3/08
See application file for complete search history.

(56) References Cited

U.S. PATENT DOCUMENTS

| | | | |
|---|---|---|---|
| 9,785,487 B1 | 10/2017 | Liu et al. | |
| 2007/0280126 A1 | 12/2007 | Liu et al. | |
| 2008/0237754 A1 | 10/2008 | Solomon | |
| 2009/0016033 A1* | 1/2009 | Chow | H01L 23/5387 361/749 |
| 2011/0312303 A1 | 12/2011 | Brush et al. | |
| 2013/0009304 A1* | 1/2013 | Ko | H01L 24/16 257/737 |
| 2014/0164511 A1 | 6/2014 | Williams et al. | |
| 2014/0302740 A1 | 10/2014 | Nag | |
| 2015/0296152 A1 | 10/2015 | Fanello et al. | |
| 2015/0365379 A1 | 12/2015 | Wu et al. | |
| 2016/0086052 A1 | 3/2016 | Piekniewski et al. | |
| 2016/0361662 A1 | 12/2016 | Karunaratne | |
| 2017/0316343 A1* | 11/2017 | Shamsi | G06N 20/00 |
| 2018/0025268 A1* | 1/2018 | Teig | G06N 3/063 706/25 |

OTHER PUBLICATIONS

Teig, U.S. Appl. No. 15/231,787 titled "Machine learning through multiple layers of novel machine trained processing nodes" filed Aug. 9, 2016, 42 pages.

Teig, U.S. Appl. No. 15/231,789 titled "Machine learning through multiple layers of novel machine trained processing nodes" filed Aug. 9, 2016, 42 pages.

Arthur, John V., et al. "Building block of a programmable neuromorphic substrate: A digital neurosynaptic core." the 2012 international joint conference on Neural networks (IJCNN). IEEE, 2012. (Year: 2012).

Cassidy, Andrew S., et al. "Real-time Scalable Cortical Computing at 46 Giga-Synaptic OPS/Watt with ~100x Speedup in Time-to-Solution and ~100,000 x Reduction in Entergy-to-Solution." Proceedings of the International Conference for High Performance Computing, Netwroking, Storage, and Analysis, IEEE Press, 2014. (Year: 2014).

Cassidy, A., et al., "TrueNorth: A High-Performance, Low-Power Neurosynaptic Processor for Multi-Sensory Perception, Action, and Cognition." Proceedings of the Government Microcircuits Applications & Critical Technology Conference, Orlando, FL, USA. 2016. (Year:2016).

Modha, "Revealed: A Scale-Out Synaptic Supercomputer (NS1e-16)", retrieved on Oct. 1, 2019, from https://modha.org/2015/12/revealed-a-scale-out-synaptic-supercomputer-ns1e-16/, 9 pages.

Office Action for U.S. Appl. No. 15/396,267, dated Jan. 7, 2020, Teig, "Configurable machine learning assemblies for autonomous operation in personal devices", 27 pages.

Wen, Wei, et al. "A New Learning Method for Inference Accuracy, Core Occupation, and Performance Co-optimization on TrueNorth Chip" 2016 53rd ACM/EDAC/IEEE Design Automation Conference (DAC). IEEE, 2016. (Year: 2016).

Choi, et al., "A 3.4 W Obect-Adaptive CMOS Image Sensor with Embedded Gesture Extraction Algorithm for Motion-Triggered Object-of-Interest Imaging", IEEE, Journal of Solid-State Circuits, vol. 49, No. 1, 2014, 12 pages.

DeBole, "Boot Camp Prep-Behind the Scene: Hardware Edition", retrieved on Mar. 23, 2020, at http://www.michaeldebole.com/?p=111, published on Aug. 15, 2015, 3 pages.

Office Action for U.S. Appl. No. 15/396,267, dated Mar. 18, 2020, Teig, "Configurable machine learning assemblies for autonomous operation in personal devices", 33 pages.

Office Action for U.S. Appl. No. 15/396,267, dated Aug. 12, 2020, Teig, "Configurable machine learning assemblies for autonomous operation in personal devices", 49 pages.

Kumar et al., "Wireless telemetry system for real-time estimation of ship air wakes with UAVs," Elsevier Ltd., CC 2016, 9 pages.

Office Action for U.S. Appl. No. 15/396,267, dated Apr. 7, 2021, Teig, "Configurable machine learning assemblies for autonomous operation in personal devices", 74 Pages.

Courtland, "Intel Now Packs 100 Million Transistors in Each Square Millimeter", IEEE Spectrum, retrieved on Mar. 30, 2017, at <<https://spectrum.ieee.org/nanoclast/semiconductors/processors/intel-now-packs-100-million-transistors-in-each-square-millimeter>>, 2017, 5 pgs.

Office Action for U.S. Appl. No. 15/396,267, dated Jul. 16, 2021, Teig, "Configurable machine learning assemblies for autonomous operation in personal devices", 15 Pages.

\* cited by examiner

CONFIGURABLE SMART OBJECT SYSTEM WITH METHODS OF MAKING MODULES AND CONTACTORS

RELATED APPLICATIONS

This continuation-in-part patent application claims the benefit of priority to U.S. patent application Ser. No. 15/396,267 to Teig et al. (U.S. Pre-Grant Patent Publication 20180025268, published Jan. 25, 2018), which in turn claims priority to U.S. Provisional Patent Application No. 62/365,253 to Teig, filed Jul. 21, 2016; and claims the benefit of priority to U.S. Provisional Patent Application No. 62/563,500 to Haba, filed Sep. 26, 2017, all of these incorporated by reference herein in their entirety.

BACKGROUND

It has been a long-term goal of machine learning science to develop algorithms that achieve highly complex cognitive tasks, such as reasoning, learning, and perception (recognizing scenes, objects, or faces). Machine learning is a type of artificial intelligence (AI) that gives computing devices the ability to learn without being explicitly programmed. Machine learning may also involve applications and computer programs that can teach themselves to grow and modify themselves when exposed to new data. Machine learning can provide vast improvements in the accuracy of both computer vision and machine vision, for example.

Recently it has been demonstrated that neural networks can outperform traditional algorithms in image classification, as well as object and facial recognition tasks. Deep learning neural networks are now able to classify objects in images with near-human-level performance. However, machine learning architectures require large amounts of computational power, and training neural networks requires large data sets with computations performed on large CPUs or GPU clusters, oftentimes located in large private and public datacenters.

Even so, there has been a dramatic increase in the use of machine learning applications. This increase has been fueled by an increase in the availability of inexpensive computing power, such that many machine learning applications are now deep learning applications that utilize many layers of processing nodes. Such deep learning processes require enormous computational resources, and so are often absent from the everyday devices in the world of daily living outside of server farms and clusters of enterprise computers, where the everyday devices have more limited local computational resources.

SUMMARY

Configurable machine learning assemblies for autonomous operation in personal devices are provided. Example systems implement machine learning based on neural networks that draw low power for use in smart phones, watches, drones, automobiles, and medical devices. Moreover, the example machine learning assemblies can be made small, for example 6-20 millimeters long per module, down to nano-scale for some applications. The onboard machine learning assemblies can be powered by batteries, for example, and once onboard a small personal device, can learn to perform object recognition and autonomous decision-making without access to outside resources. In addition to their small size in some circumstances, the assemblies may draw less than one watt of power on average. An assembly can be configured from pluggable, interchangeable modules that have identical or compatible ports for interconnecting and integrating functionally dissimilar sensor systems. The ports may have identical or complementary interfaces and pinouts. An example core module of the system contains a machine learning kernel, and multiple cores can be connected together to expand the neural network. An example machine learning assembly auto-detects sensors and peripherals, and extends a network or bus to all connected components.

An example single module of the smart object system described herein is based on artificial intelligence (AI) electronics, such as a machine learning component or an artificial neural network component, for example. The example module provides one "building block" of the configurable smart object system, which may consist of various different modules connected to each other through identical or complementary physical and electronic interfaces and pinouts to form larger configurable smart object systems. An example customized and configured smart object system, in turn, is made of a custom collection of such modules connected together, and brings artificial intelligence (AI), such as machine learning or an artificial neural network, to everyday devices, with the goal of adding a degree of artificial intelligence to the everyday device in a closed system that does not need to consult outside itself to make intelligent decisions, nor rely on outside resources for computing power or analysis of data.

This summary is not intended to identify key or essential features of the claimed subject matter, nor is it intended to be used as an aid in limiting the scope of the claimed subject matter.

BRIEF DESCRIPTION OF THE DRAWINGS

Certain embodiments of the disclosure will hereafter be described with reference to the accompanying drawings, wherein like reference numerals denote like elements. It should be understood, however, that the accompanying figures illustrate the various implementations described herein and are not meant to limit the scope of various technologies described herein.

DETAILED DESCRIPTION

Overview

This disclosure describes configurable machine learning assemblies that can be used for autonomous operation in personal devices. Example systems, devices, and methods implement machine learning functions and "smart object" devices that are based on artificial neural networks that draw only low electrical power. The low power requirements enable the configurable machine learning assemblies to be used onboard smart phones, watches, drones, automobiles, medical devices, and other small personal devices, and vehicles. Machine learning assemblies onboard a mobile device or vehicle can be powered by batteries, for example, and once onboard a small personal device, can self-learn to provide smart functions, such as recognition of visual objects in images or a live camera feed, or can perform autonomous decision-making. The smart machine learning assemblies can provide these smart functions without needing to access powerful outside computing resources.

The example machine learning assemblies can be made small, microscopic, or in some cases, even nano-machine size. Even large versions of an example machine learning assembly may have a size of approximately 6-20 millimeters per component module, and may draw less than one watt of electric power on average, suitable for personal and mobile devices, medical devices, smart tools, instruments, and vehicles, for example.

An example system couples or integrates one or more sensor-based systems with a machine learning system, in a pluggable, configurable, and self-discoverable machine learning assembly. An example machine learning assembly can use complementary connectors or common identical interfaces to couple multiple functional systems that may be functionally dissimilar, such as diverse sensor systems, to form an integrated configurable system with a machine learning core.

Example Systems

Figure 1:
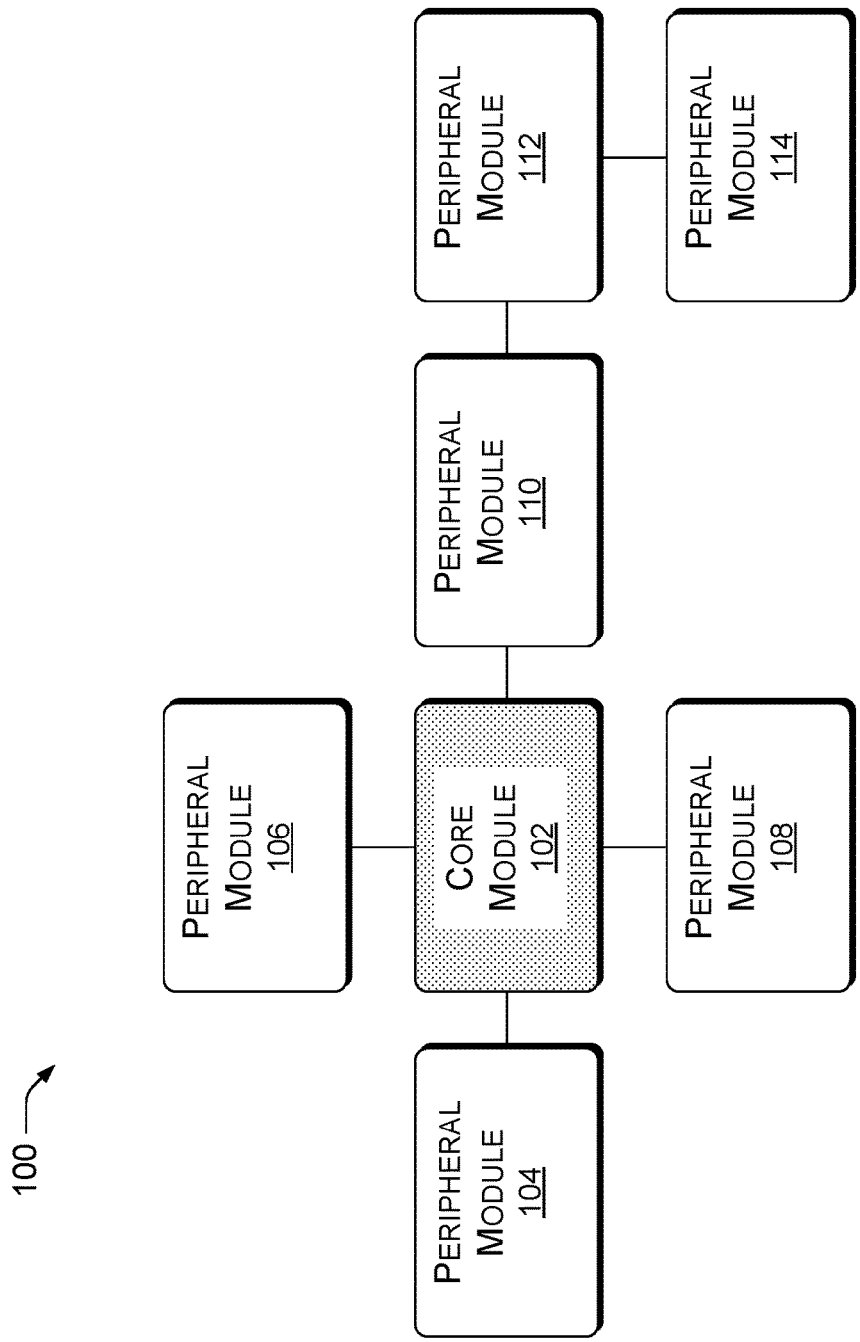
FIG. 1 is a block diagram of an example machine learning assembly.

FIG. 1 shows an example machine learning assembly 100. In an implementation, the example machine learning assembly 100 can be configured from pluggable, interchangeable modules that may each have at least one compatible port for interconnecting with each other. A "core" module 102 contains at least one machine learning kernel embodied in a neural network, and multiple core modules 102 can be coupled together in series, in parallel, or as a cluster to expand the neural network. Peripheral modules 104, 106, 108, 110, 112 & 114 are attachable to the core module 102, or to each other, but all peripheral modules can be in communication with at least one core module 102.

Figure 2:
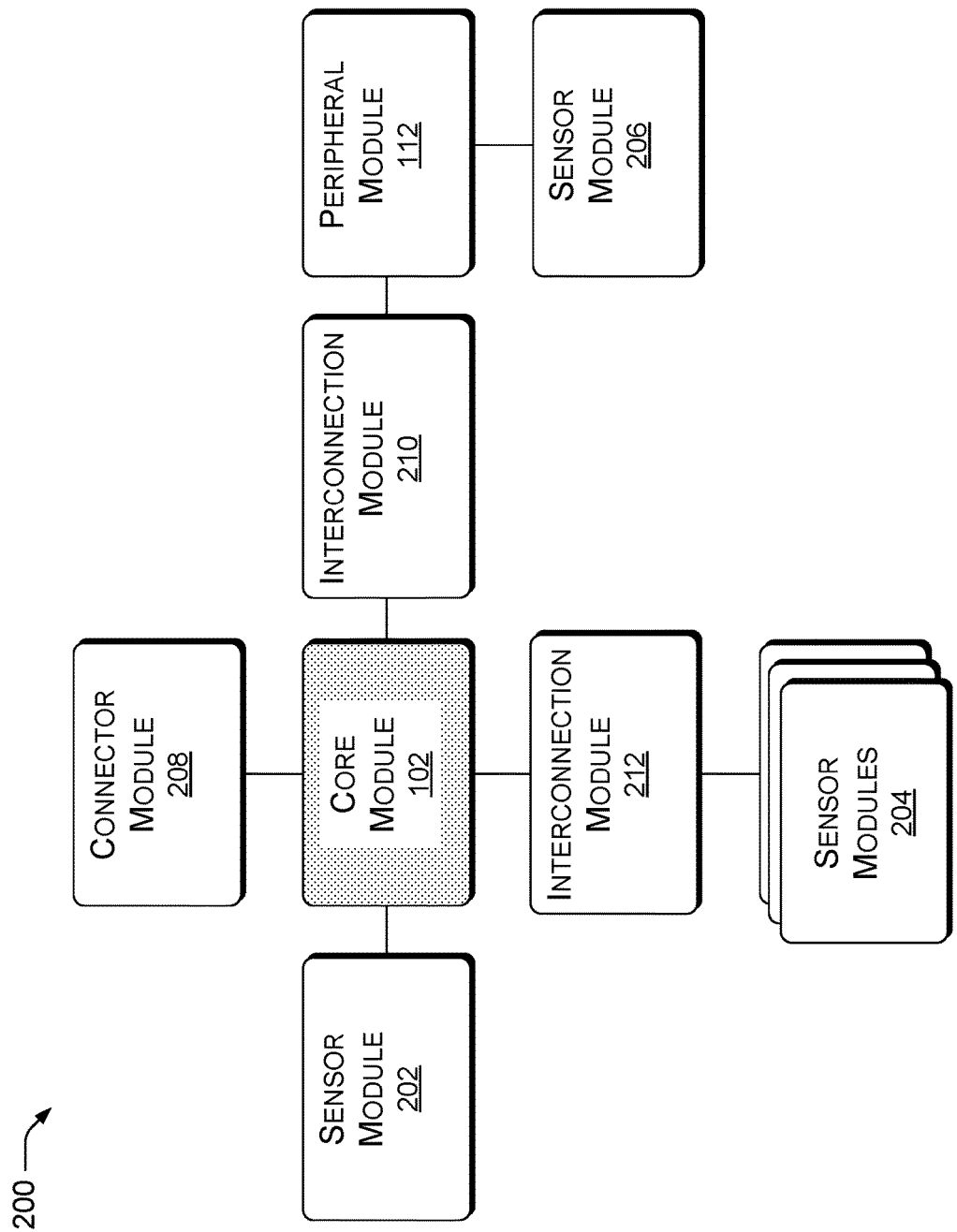
FIG. 2 is a block diagram of an example machine learning assembly with various different modules.

FIG. 2 shows another example machine learning assembly 200 ("system" 200). Various types of peripheral modules 112 can be joined to the example machine learning assembly 200 and brought into communication with the core module 102, such as sensor modules 202, 204 & 206, a connector module 208 for interfacing with a motherboard of a hosting device, for example, interconnection (adapter) modules 210 & 212, wireless transmitter modules (not shown), and other modules with other functions. The peripheral modules 112 or sensor modules 202 may be attachable systems or subsystems, such as an infrared (IR) system, an imaging system, a health system, an activity system, an environment system, and a location & orientation system, for example. These systems may include respective sensors and software. The interconnection modules 210 & 212 can intervene between other modules to adapt the modules to each other, both physically and electrically, and facilitate complex or extensive configurations of the overall assembly 200. In an implementation, the interconnection modules 210 may include analog-to-digital converters to render analog output of the sensor modules 202, 204 & 206, into digital signals for processing at the core module 102.

In an implementation, the example machine learning assembly 200 has a dynamic "nervous system" that auto-detects sensors and peripherals, and dynamically extends a communication, control, and sensor network or a common bus, across all connected components in a given machine learning assembly 200.

Figure 3:
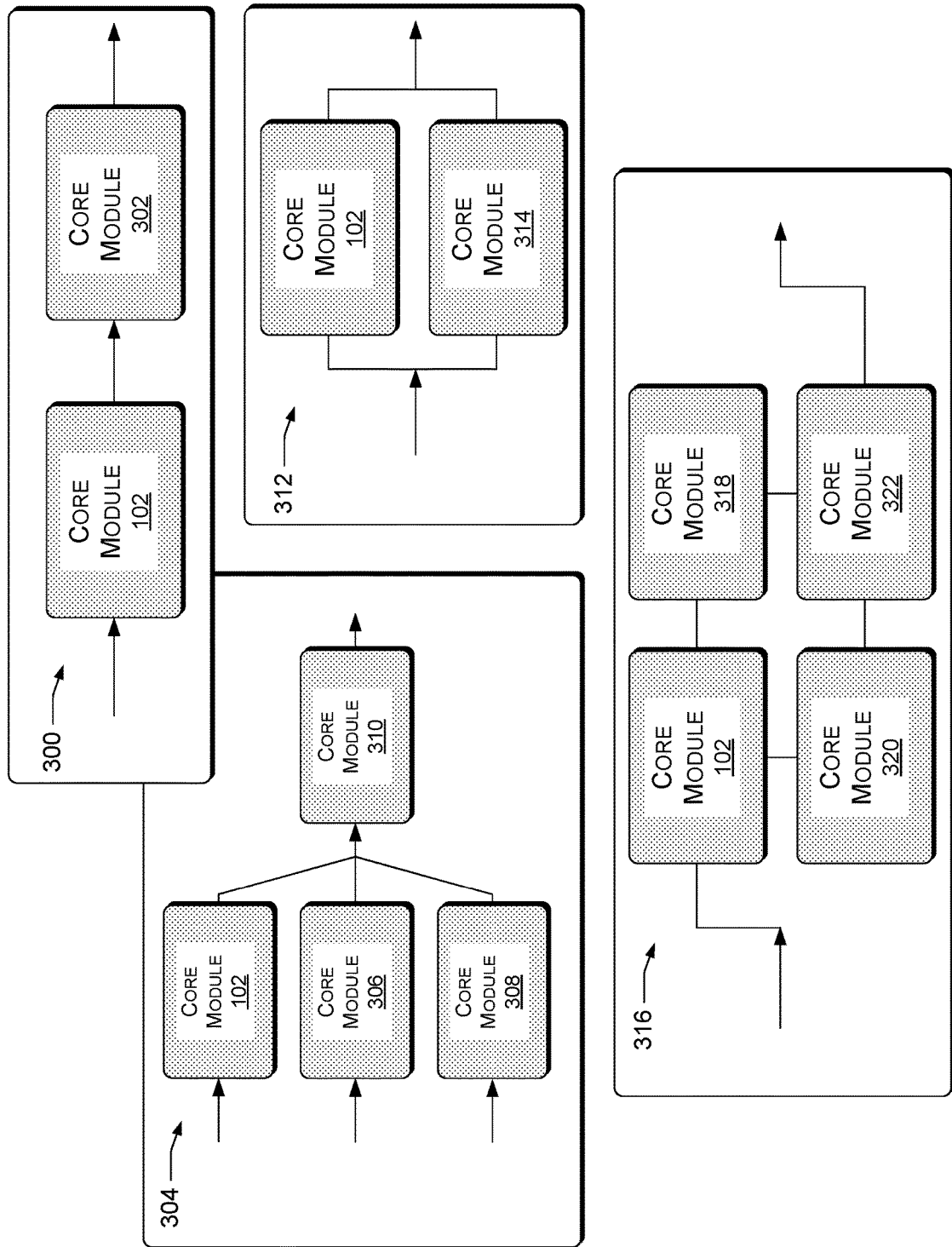
FIG. 3 is a block diagram of example configurations for combining multiple core modules of an example machine learning assembly.

FIG. 3 shows example core module configurations 300, 304, 312 & 316 for an example machine learning assembly 200. The dynamic nervous system of the example machine learning assembly 200, capable of auto-detecting sensor modules 202 and peripheral modules 112, can be based in a single core module 102 or in a grouping 300, 304, 312 or 316 of core modules 102. Besides dynamically extending a communication, control, and/or sensor network or a common bus across all connected components in a given machine learning assembly 200, the dynamic nervous system also tracks and manages the interconnection and configuration of multiple core modules when they are connected together as a group 300, 304, 312 or 316.

In one configuration 300, core modules 102 & 302, which contain at least one machine learning kernel apiece, can be connected in a series configuration 300. The output of the first neural network hosted by the first core module 102 becomes input for a second neural network hosted by the second core module 302. In this series configuration 300, the output of the first core module 102 may be a simple, conclusory result containing little data, such as a binary "yes/no" decision generated by the neural network of the first core module 102.

In a tree configuration 304, multiple core modules 102, 306, 308 & 310 are interconnected such that multiple core modules 102, 306 & 308 provide input for a single subsequent core module 310, creating a simple network of neural networks 508.

In a parallel processing configuration 312, a single source of input is sent to two or more core modules 102 & 314 connected in parallel. The multiple core modules 102 & 314 connected in parallel 312 may process the same input but apply different parameters within their respective neural networks, such as processing with different priors or with different node thresholds or different weighting schemes for the data or sensor input. The conclusions (outputs) of the paralleled core modules 102 & 314 are then compared or combined into a single final output. In another arrangement of the parallel configuration 312, the multiple core modules 102 & 314 more cleanly split a task. In yet another example scheme, the paralleled core modules 102 & 314 are connected redundantly, for checking each other's output, i.e., for component failure, or to give confidence to results.

In a cluster configuration 316, multiple core modules 102, 318, 320 & 322 are interconnected to make a single expanded neural network. At least one of the core modules 102 has a component that is used to configure and manage the arrangement of the core modules 102, 318, 320 & 322, in one of many possible cluster configurations 316.

Figure 4:
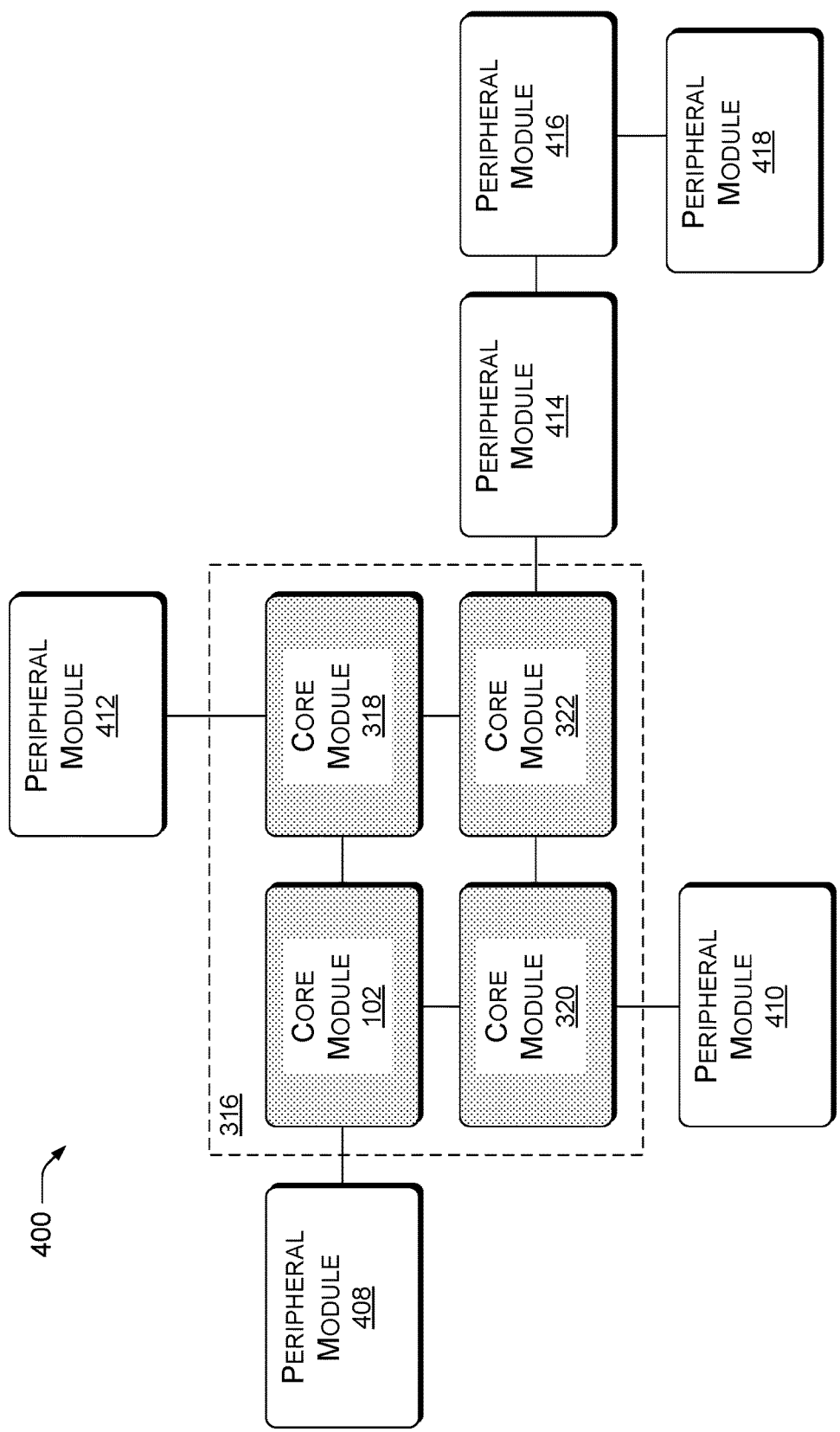
FIG. 4 is a block diagram of an example machine learning assembly with an expanded neural network made by interconnected core modules.

FIG. 4 shows an example machine learning assembly 400 with a cluster configuration 316 of the core modules 102, 318, 320 & 322. FIG. 4 shows an example configuration of peripheral modules 408, 410, 412, 414, 416 & 418, connected to a cluster configuration 316 of the core modules.

Figure 5:
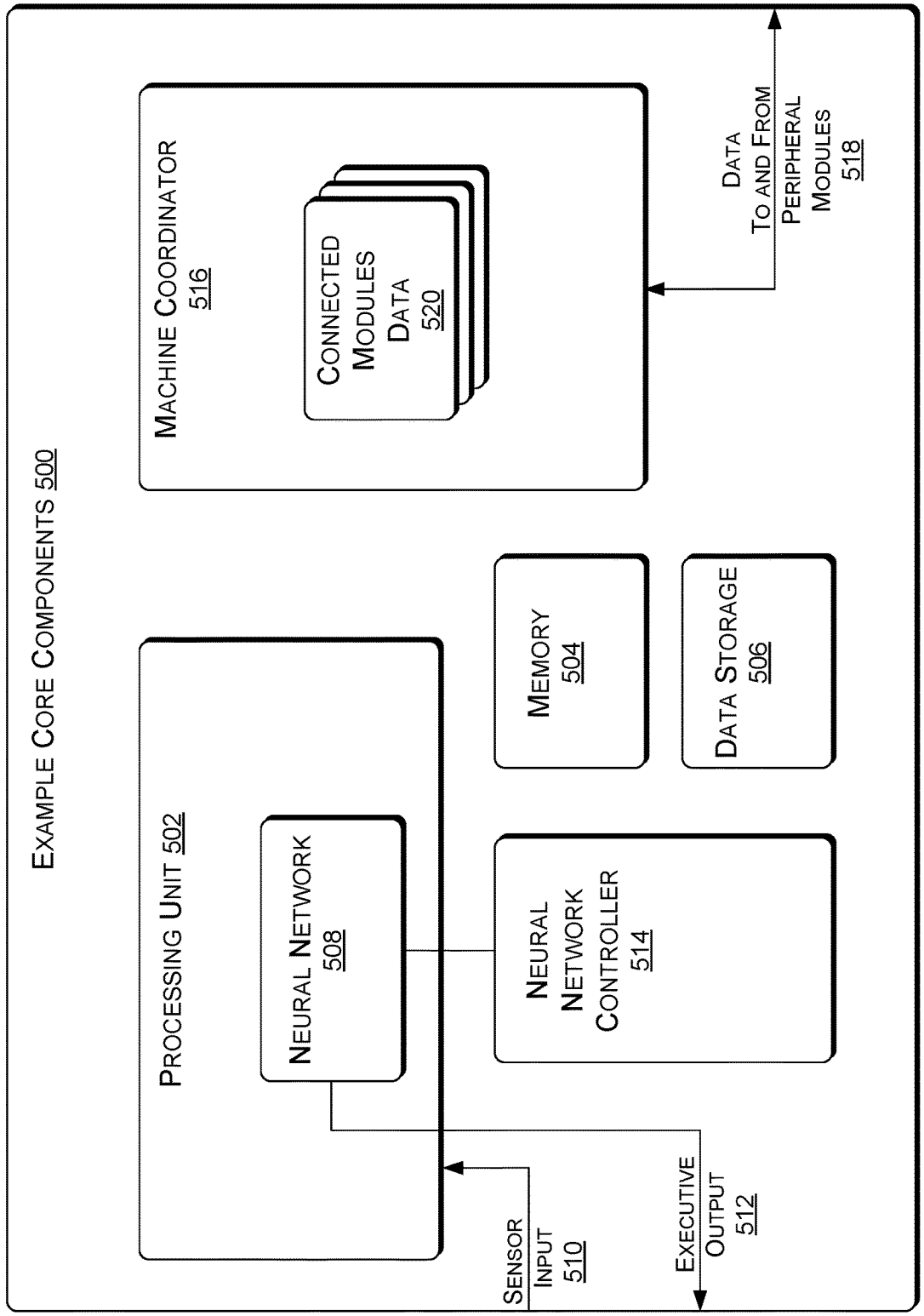
FIG. 5 is a block diagram of an example machine learning core of an example machine learning assembly.

FIG. 5 shows example core components 500 of the example core module 102 of FIGS. 1-3, in greater detail. FIG. 5 shows only one example of core components 500 for the sake of description. Many other configurations of example core components 500 are also possible. In an implementation, the example core components 500 are implemented mostly or completely in hardware, such as application-specific integrated circuits (ASICs) and similar packages.

In an implementation, the example core components 500 include at least one processing unit 502, a memory 504, and data storage 506, for example. A neural network 508 resides in, or is associated with at least a component of the processing unit 502. The processing unit 502 receives input data 510 from sensors either directly or indirectly, and/or receives other data input. Significantly, in an implementation, all the raw data 510 input from sensors to a core 102 remains within the system 200. For control and security, if any raw digital data or raw analog data is selected to leave the system 200, the data being released is only released from the processing unit 502, and the decision to release the data is reserved to the processing unit 502. The outgoing executive output 512 is generally an indicator, decision, or control directive generated by the neural network 508 that also remains within the device or machine hosting the example machine learning assembly 200, and is not raw data 510 incoming from sensors.

The neural network 508 processes the input data 510 via one or more machine learning functions or other artificial neural network techniques, and produces executive output data 512 or an executive output signal 512. The executive output 512 may consist of very little data, such as a simple decision or single directive, compared with the input data 510, which can be any amount of data. In an implementation, the core components 500 do not store all of the data generated by sensors or generated as input data 510, but can use the input data 510 to generate executive output 512 via the neural network 508, and then can delete or forego saving the input data 510. Regardless, the input data 510 from sensors does not leave the machine learning assembly 200 unless such a data export is explicitly configured to occur under permission from the processing unit 502.

A neural network controller 514 in the core 500 can configure the neural network 508, including, in one implementation, controlling multiple machine learning kernels and cores components 500 in the same core module 102. The example neural network controller 514 can configure the neural network 508 for autonomously performing visual object recognition and decision-making in small personal devices based on functions and algorithms that can be scaled to accomplish complex tasks while at the same time achieving low power consumption levels that make mobile and remote implementations feasible.

A machine coordinator 516 in the core 500 configures and maintains the overall machine learning assembly 200. The machine coordinator 516 may embody the dynamic nervous system introduced above that auto-detects sensor modules 202 and various peripheral modules 112, and dynamically extends a communication, control, and/or sensor network or a common bus across all connected components in a given machine learning assembly 200. The machine coordinator 516 may store currently connected modules data 520, such as the statuses and various operational and connectivity parameters of each module connected to the example machine learning assembly 200. Via an onboard network or bus, the machine coordinator 516 coordinates communication, control, and sensor data to and from peripheral modules 518 connected to the core module 102.

Figure 6:
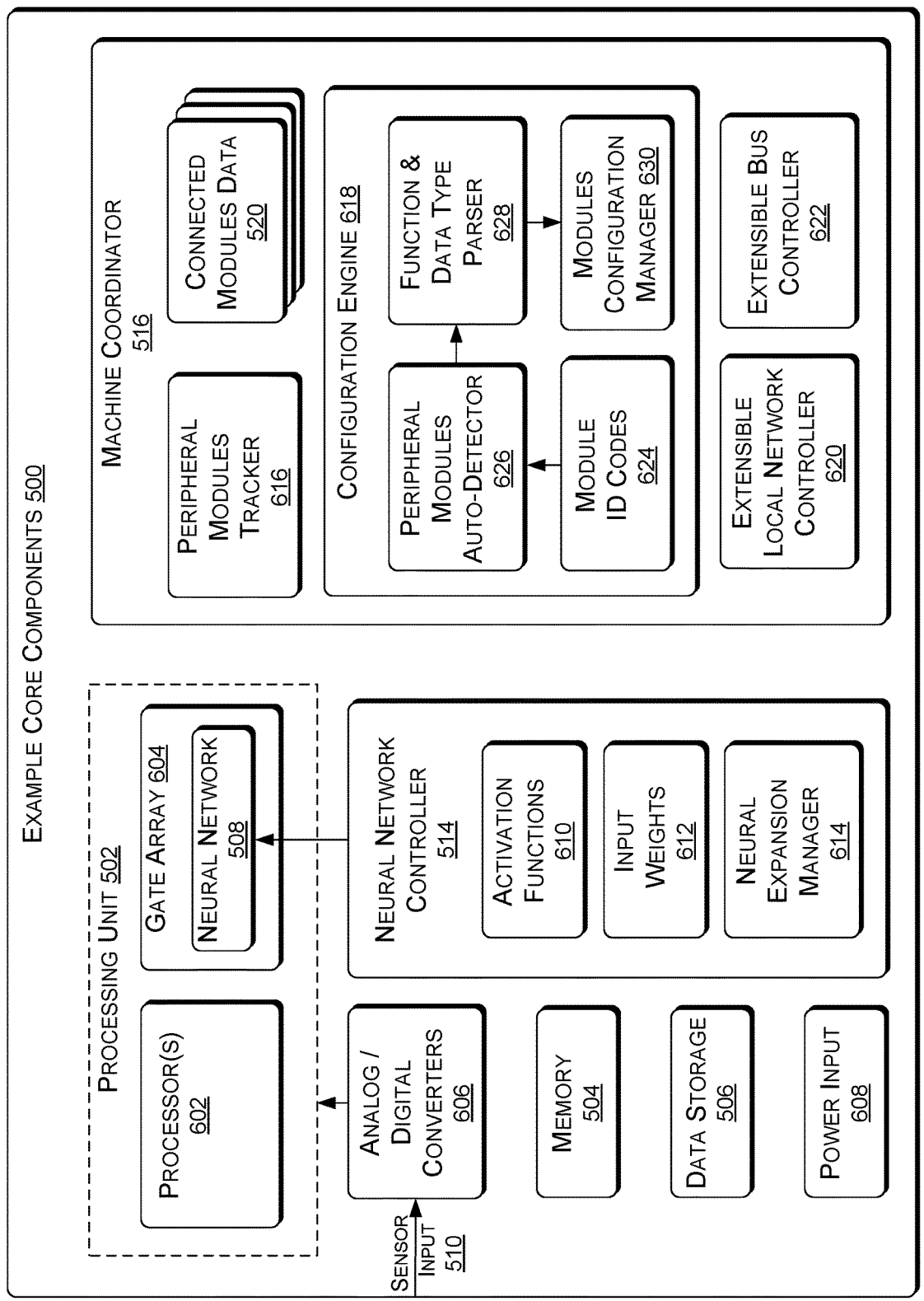
FIG. 6 is a block diagram of the example machine learning core of FIG. 5, in greater detail.

FIG. 6 shows the example core components 500 of FIG. 5 in greater detail. FIG. 6 represents only one example embodiment of the core components 500 for the sake of description. Many other configurations of example core components 500 are also possible. In an implementation, the example core components 500 are implemented mostly or completely in hardware, such as application specific integrated circuits (ASICs) and the like.

In an implementation, example core components 500 include one or more computing processors 602 in the processing unit 502, and/or one or more gate arrays 604, such as one or more field programmable gate array devices 604. A neural network 508 is shown as configured in the gate array 604, but can also be implemented as program instructions in the one or more computing processors 602.

The example core components 500 may include discrete analog-to-digital converters 606 to render analog sensor input 510 into digital signals for the processing unit 502. The example core 500 may also have a power input 608, such as connection to battery power or connection to power from a hosting device, or the example core components 500 may include the batteries themselves.

The neural network controller 514 may implement one or more power-efficient neural networks 508 by applying activation functions 610 and weightings 612 of input data 612 for specific nodes of the neural network 508 being implemented. Examples of neural networks 508 that draw low electrical power and thereby enable the small, autonomous, and portable machine learning assemblies 200 are described further below. The neural network controller 514 may also include a neural expansion manager 614, which manages interconnected core modules 102, as shown in FIGS. 3 & 4.

Besides storing or maintaining a database of connected modules data 520, the machine coordinator 516 of the example core components 500 may also include a peripheral modules tracker 616, a configuration engine 618, an extensible local network controller 620, and an extensible bus controller 622, for example.

The example configuration engine 618 may store module identification (ID) codes, for identifying various different pluggable modules that may become connected to the example machine learning assembly 200. An auto-detector 626 receives an ID code 624 from a newly connected peripheral module 112, and communicatively adds or logs on the newly connected peripheral module 112 to the machine learning assembly 200, via the onboard network or bus. The extensible local network controller 620 and/or the extensible bus controller 622 may implement connection to the local onboard bus or network via physical ports and connectors between modules that have conductive electrical connectors, or may implement wireless connections between modules, by Wi-Fi, Bluetooth, ZigBee, or infrared, for example. Once a peripheral module 112 is communicatively added and/or logged on to the example machine learning assembly 200, a function-and-data-type parser 628 establishes the identity and purpose of the peripheral module 112, as well as compatible communication with the added peripheral module 112. A configuration manager 630 may outfit the newly added peripheral module 112 with compatibility parameters or desired settings, and normalize a communication protocol between the core module 102 and each connected peripheral module 112 or sensor module 202.

Example Apparatuses

In an implementation, components of the example machine learning assemblies 200 may be embodied in discrete housing packages of a modular smart object system.

Figure 7:
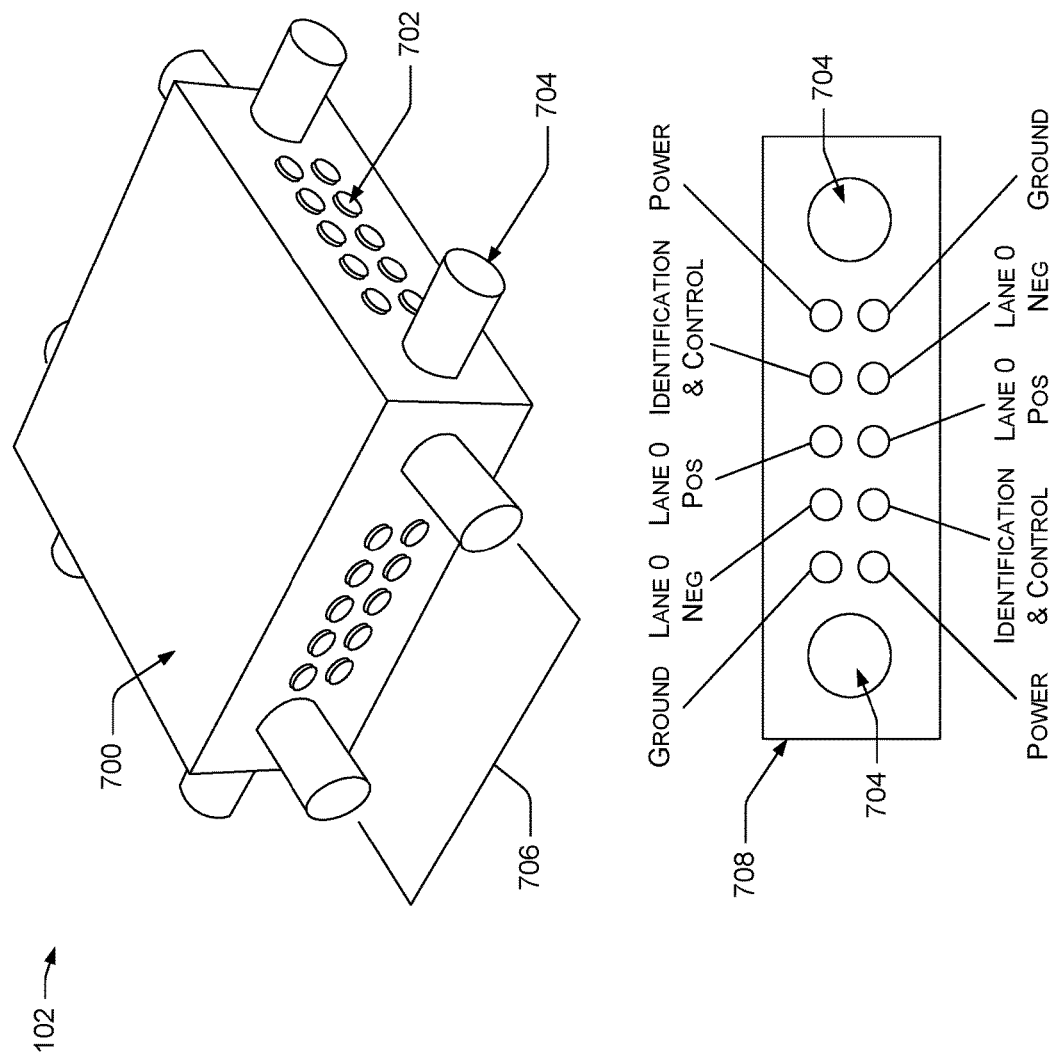
FIG. 7 is a diagram of an example housing for a module of a machine learning assembly, and an example pinout of a port on the module.

FIG. 7 shows a first example implementation of a housing 700 for a module 102 or component of the machine learning assembly 200, such as an example housing 700 of a core module 102, a sensor module 202, or other component. The housing 700 may include electrical contacts 702 for forming electrical connections with other components, including additional machine learning core modules 102, with electrical interconnection components 210, with sensor modules 202, or with other electrical or electronic components. The example housing 700 may also include one or more physical connection features 704, which may assist in orienting, aligning, and physically coupling the example housing 700 to another compatible component or housing. In an implementation, the electrical contacts 702 and physical connection features 704 combine to form a single purposed port 706, which is an example complementary interface and pinout configuration to be used by all the modules and components in a given smart object system.

The example housing 700 may be constructed using well-established electronics packaging techniques. In certain implementations, portions or the entirety of the example housing 700 may be printing using a 3D printer.

An example pinout 708 of the example port 706 may have symmetrical features, so that each port 706 and its resulting connection with other complementary modules and connectors are reversible: the modules and connectors can be mated in either direction. In an implementation, the various modules possible in a machine learning assembly 200 all use identical interfaces with identical or complementary pinouts and the same pin functionalities. In an example implementation, pin 1 is ground (GND), pin 2 is lane 0 negative, pin 3 is lane 0 positive, pin 4 is identification or control, and pin 5 is power (PWR). In an implementation, a second or opposing row of pins is in reverse order, providing a reversible pluggable port 706. Many other pinouts 708 of the example port 706 are possible, including different pin counts in different configurations with different and additional electrical connections to the pins. However, for a given implementation of the example machine learning assembly 200, the interfaces between modules can be identical among the modules in that assembly.

Figure 8:
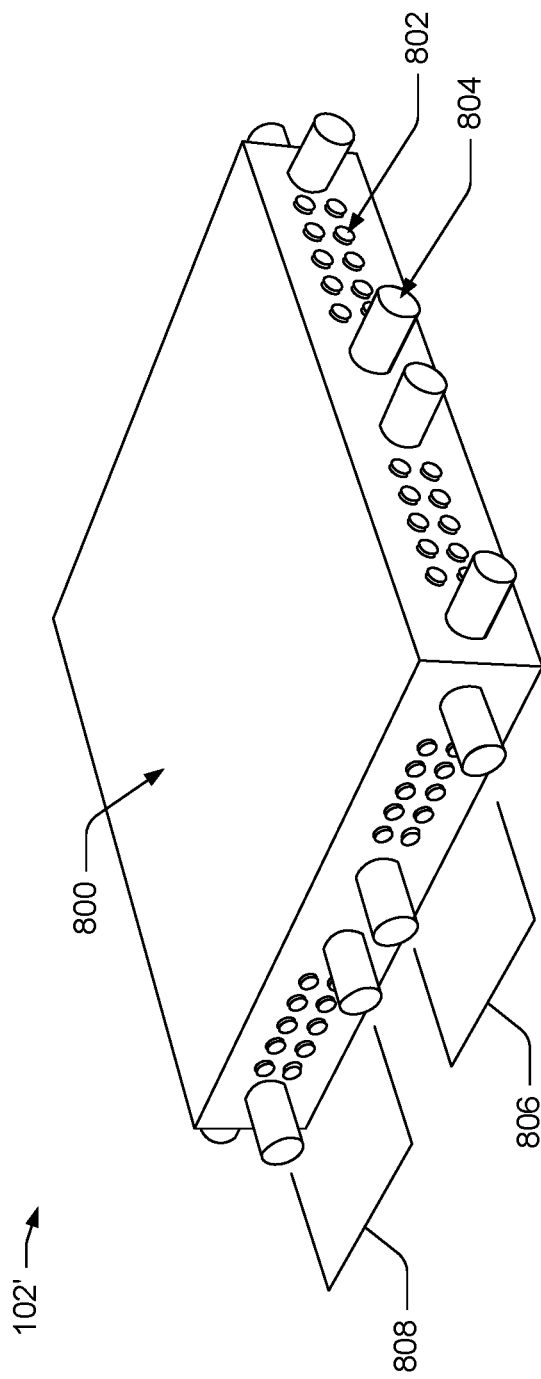
FIG. 8 is a diagram of another example housing for a module of a machine learning assembly, with multiple ports on a side.

FIG. 8 shows a second example implementation of a housing 800 for a module of a machine learning assembly, such as an example housing of a core module 102', a sensor module 202, or other component. The example housing 800 may have multiple sets of electrical connections 802 and connection features 804 on a given side, providing multiple ports 806 & 808 for a given connection, to mate with a given connector.

Figure 9:
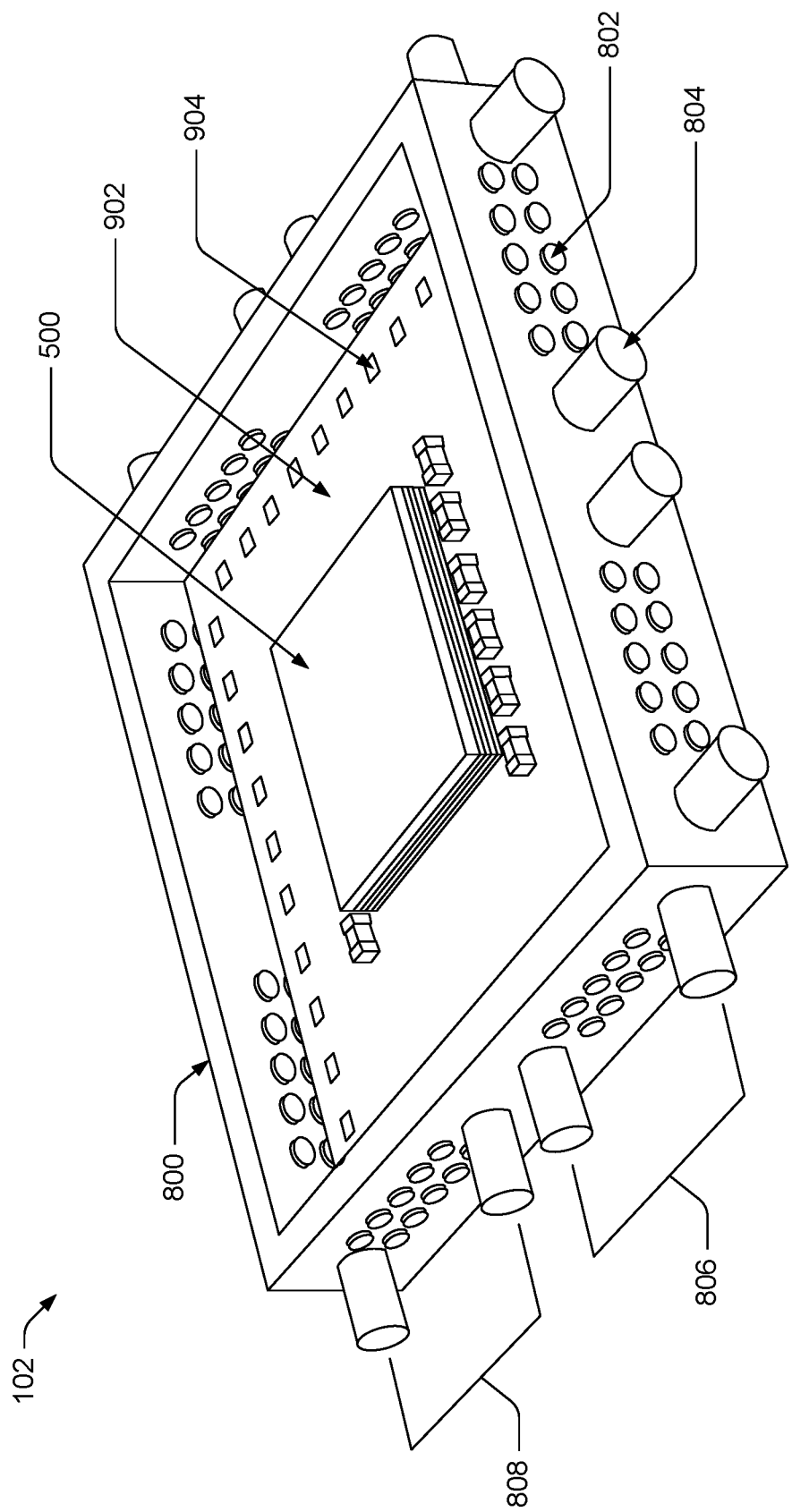
FIG. 9 is an inside-view diagram of an example core module with an example machine learning core.
Figure 10:
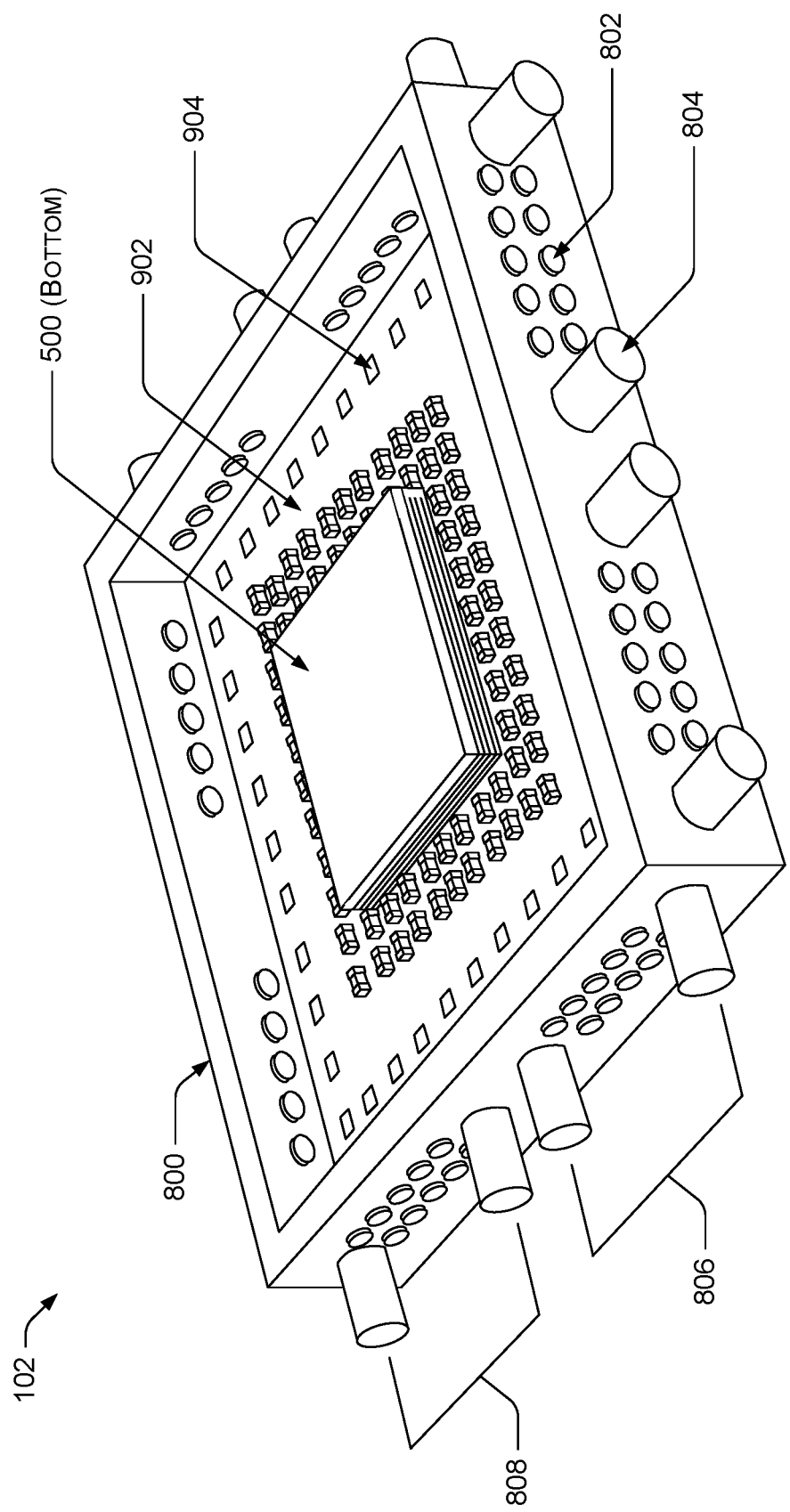
FIG. 10 is a bottom-view diagram of the example core module of FIG. 9.

FIG. 9 shows an inside view of an example machine learning core module 102 and example housing 800. Likewise, FIG. 10 shows an inside bottom view of the same core module 102 of FIG. 9. In an implementation, the example housing 800 encloses or encapsulates the example core components 500, including electronics and at least one neural network 508, providing the machine learning kernel of the core module 102. The machine learning core 500 may be provided on a substrate 902 and coupled as a system to one or more active or passive components, support components, contact pads 904, and so forth, in a manner appreciated by those skilled in the art of application processors 602 and processing units 502. The internal electronic components may interact with other components through conductive traces, wires, and printed circuits, such as electrical connections between the pads 904 and the electrical "pin" connections 802 provided on the housing 800.

As above, the core components 500 may include electronic components such as the memory 504, power supply 608, user interfaces, and other suitable electronic components that support, improve, or otherwise affect the machine learning functions to be performed in the neural network 508. Some of these core components 500 may either be in the example housing 800, or these components may be in one or more other housings external to the example housing 800, and may interact with the other core components 500 through the electrical connections 802 of a port 806. The core components 500 communicate with the sensor module(s) 202 and other components through such electrical connections 802 and corresponding electrical circuits.

As mentioned above, the housing 800 for the core components 500 may have one or more ports 706 or sets of ports 806 & 808, each port 806 including one or more electrical connections 802 and one or more physical connection features 804. The figures shown herein illustrate examples of ports 706, 806 & 808, but other configurations may additionally or alternatively be provided. In certain implementations, the electrical connections 802 themselves can provide a physical coupling force between two housings 800, such as between a housing 800 of a core module 102 and a housing of a sensor module 202. For example, one type of electrical connection 802 may include socket and plug features, or magnetic clasp features. In such a case, separate physical connection features 804 may be omitted from a given port 806.

Each port 806 or set of ports 806 & 808 may permit electrical and data input and/or output from a machine learning kernel or core components 500 in a core module 102. In addition to the port 806 having symmetry, such that the plug and/or connection is reversible, in an implementation the port 806 may have a standardized or semi-universal layout so that multiple different sensors 202 or other diverse components may be interchangeably connected to the same port 806 or set of ports 806 & 808 at different times. One or more ports 806 may be provided on any viable side of a given core module 102. Once connected, the example port 806 may maintain a connection with the connected sensor module 202 or other component through magnetic, friction, latch, cord or other suitable mechanisms or forces.

In an implementation, there is not a physical connection between each and every module or component belonging to a given machine learning assembly 200, but instead at least one communicative coupling is a wireless one.

In certain implementations, the coupling between ports 806 is such that a sensor module 202 or other component can be non-destructively detached and reattached. Such a pluggable, releasable and reusable connection allows sensors 202 and other components to be replaced, or various sensors and components to be swapped out for each other. For example, such replacement or swapping may include replacement of a first sensor with a second sensor that has different functionality or performance than the first sensor, or other component.

As introduced above, the port 806 or sets of ports 806 & 808 may be provided on any of the viable surfaces of the housing 800 of a core module 102. The ports 806 or sets of ports 806 & 808 may be aligned symmetrically or in a pattern with respect to the surfaces. Opposing sides of a given example housing 800 may have similar ports 806 & 808 with a similar or even identical layout about a plane, axis, or point.

Figure 11:
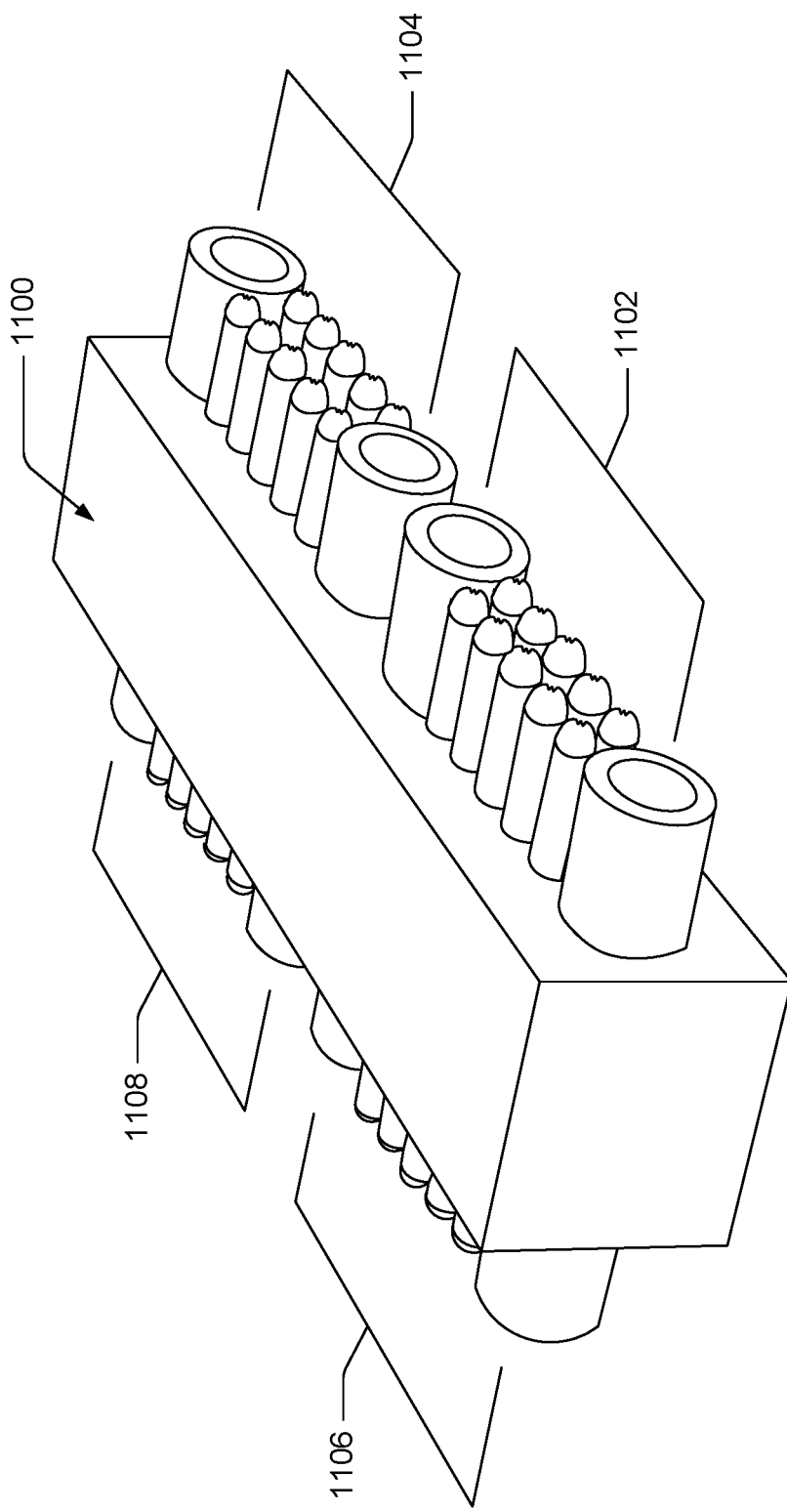
FIG. 11 is a diagram of an example interconnection module with ports on two opposing sides.

FIG. 11 shows an example interconnection component 1100. Each port connector 1102 or set of port connectors 1102 & 1104 is configured to interconnect, both physically and electrically, with a port 706 or set of ports 806 & 808 on the housing 800 of a module 102 or another interconnection component 1100. In the shown example, each side of the interconnection component 1100 may connect modules with single ports, such as two of module 102 in housing 700 shown in FIG. 7, connected, for example, on port connectors 1102 & 1104, or may connect one multiple-port module, such as module 102' in housing 800 shown in FIG. 8. On another side of the interconnection component 1100, port connectors 1106 & 1108 may interconnect still other modules to the modules connected to port connectors 1102 & 1104.

Electrical coupling depends on the internal wiring of the example interconnection component 1100. All four port connectors 1102 & 1104 & 1106 & 1108 may be wired together, so that each port connector couples with all of the other three port connectors. Or, in an implementation, port connector 1102 may be wired straight across to port connector 1106, and likewise port connector 1104 may be wired straight across to port connector 1108.

The modules being connected by interconnection component 1100 may be core modules 102 containing machine learning kernels and core components 500, modules 202 containing sensors (or sensor systems), or other electrical components or some combination thereof, each of these having at least one compatible port 706.

The example interconnection components 1100 can be rigid, semi-rigid, semi-flexible, or flexible. Interconnection allows data to be communicated in either direction between the sensor modules 202 and the core components 500 of a core module 102. The interconnection may also be configured directly without an interconnection module 1100, but either way interconnection enables signals to be passed through a first non-core sensor/component along to a second non-core sensor/component that is interconnected to the first sensor/component. In certain implementations it may be advantageous to interconnect the second non-core sensor/component back to a core module 102 to form a signal loop, for example.

Figure 12:
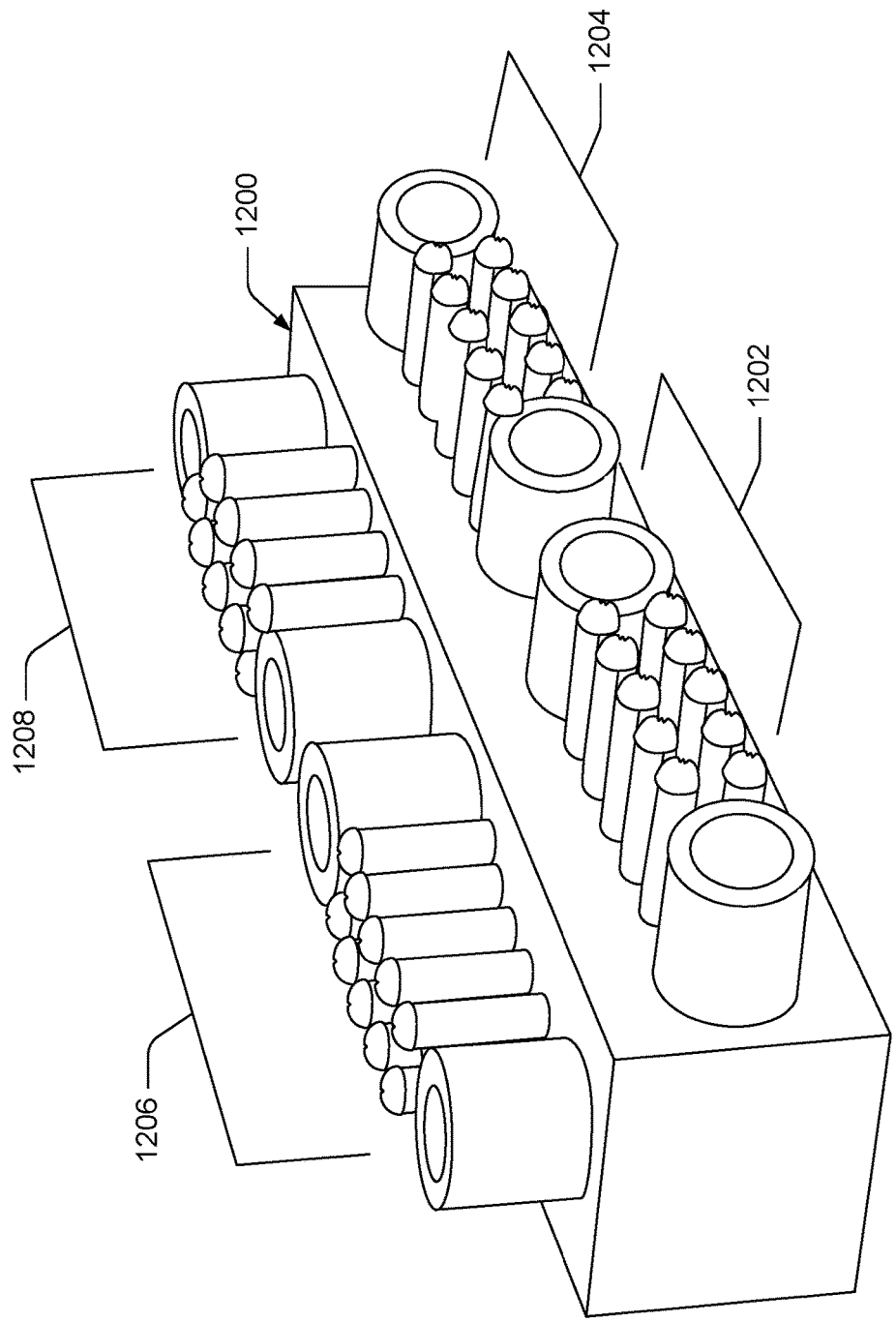
FIG. 12 is a diagram of an example interconnection module with ports on two adjacent sides.

FIG. 12 shows another example interconnection component 1200. In this example, the port connectors 1202 & 1204 are disposed at 90 degrees to port connectors 1206 & 1208, thereby providing a right-angle interconnection member 1200 for building various structures of a machine learning assembly 100. Multiple instances of the interconnection component 1200 may also be used to create complex or custom shapes of a machine learning assembly 100 in different planes.

Figure 13:
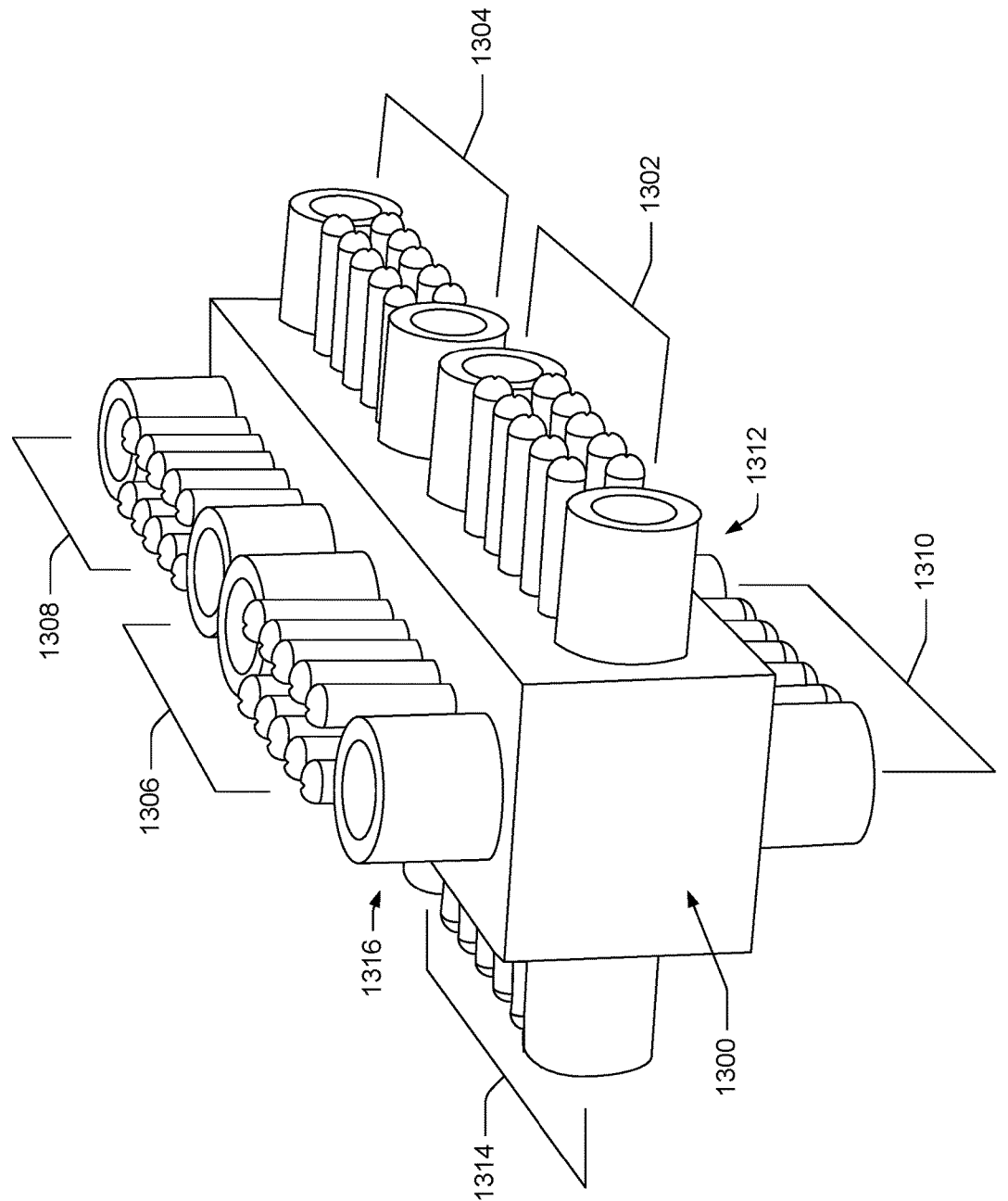
FIG. 13 is a diagram of an example interconnection module with ports on three adjacent sides.

FIG. 13 shows an example ganged interconnection component 1300, with four-way port connection capability. The eight port connectors 1302 & 1304 & 1306 & 1308 & 1310 & 1312 & 1314 & 1316 of the example ganged interconnection component 1300 can connect up to eight modules 700 with single ports 706 or four modules 800 with double ports 806 & 808, for example. The example ganged interconnection component 1300 enables many possible arrangements, because different internal wiring schemes are possible, and because not all of the port connectors have to be utilized at once. For example, the example ganged interconnection component 1300 may connect modules on three of its sides, creating a first plane of modules with a second plane of modules perpendicular to the first plane. Or, the port connectors on all four sides may be utilized, to create two intersecting planes of modules. Example internal wiring schemes may include two straight-through, but separate electrical couplings, right angle electrical couplings, or common couplings in which all the port connectors are wired to each other.

Figure 14:
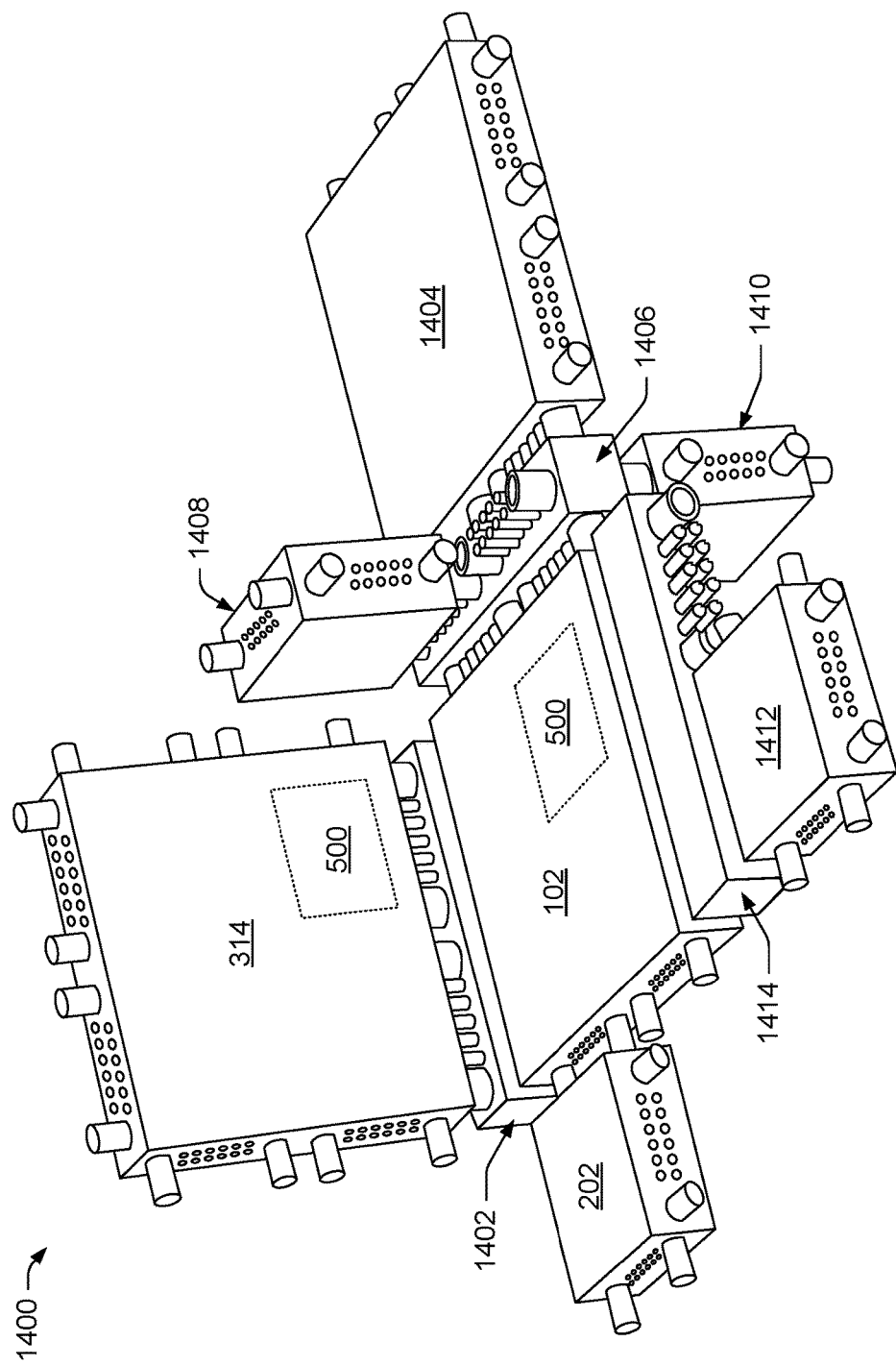
FIG. 14 is a diagram of interconnected modules constituting an example machine learning assembly.

FIG. 14 shows an example configuration of a machine learning assembly 1400, with core modules 102 & 314, each containing at least one set of core components 500 & 500', coupled together via interconnection module 1402. Sensor module 202 is coupled with core module 102, utility module 1404 is coupled to core module 102 via interconnection module 1406, sensor modules 1408 & 1410 are coupled to core module 102 and to utility module 1404 via interconnection module 1406. Sensor module 1412 is coupled to core module 102 via interconnection module 1414.

The example utility module 1404 may be an additional sensor system, a camera system, a computing system, a laboratory-on-a-chip module, a GPS system, an accelerometer, flash drive mass data storage, a wireless Wi-Fi or infrared transceiver, a battery, or can be one of numerous other electrical, electronic, or optical components or systems. The utility module 1404 can also be an executive component performing the executive output 512 of the neural network 508, such as a controller, an actuator, an alarm, a solenoid, a navigation system, a user interface intermediary, a display driver, camera electronics, a transmitter, an electrode, a digital to analog converter, an implantable medical device interface, an insulin pump controller for a medical patient, a pacemaker trigger, an implantable cardioverter-defibrillator interface, a hospital IV pump controller, a pager, a cell phone element, a heating-air-conditioning-and-ventilation governor, and so forth, as examples.

In an implementation, the modules of the example machine learning assembly 1400 are very small, and the finished structure may be secured to a motherboard or device, for example. The example machine learning assembly 1400 may also be permanently encapsulated, if the configuration of the assembly 1400 is finalized and various sensor modules 202 will not need to be replaced, or, if the entire assembly 1400 is deemed replaceable or disposable when the hosting device expends its lifespan. Larger versions of the example machine learning assembly 1400 may be approximately 6-7 millimeters on a side, and may be encapsulated or otherwise made into a permanent assembly 1400, but the example machine learning assembly 1400 may also be left configurable for later modification, with the pluggable and detachable modules capable of being detached, replaced, and swapped.

Figure 15:
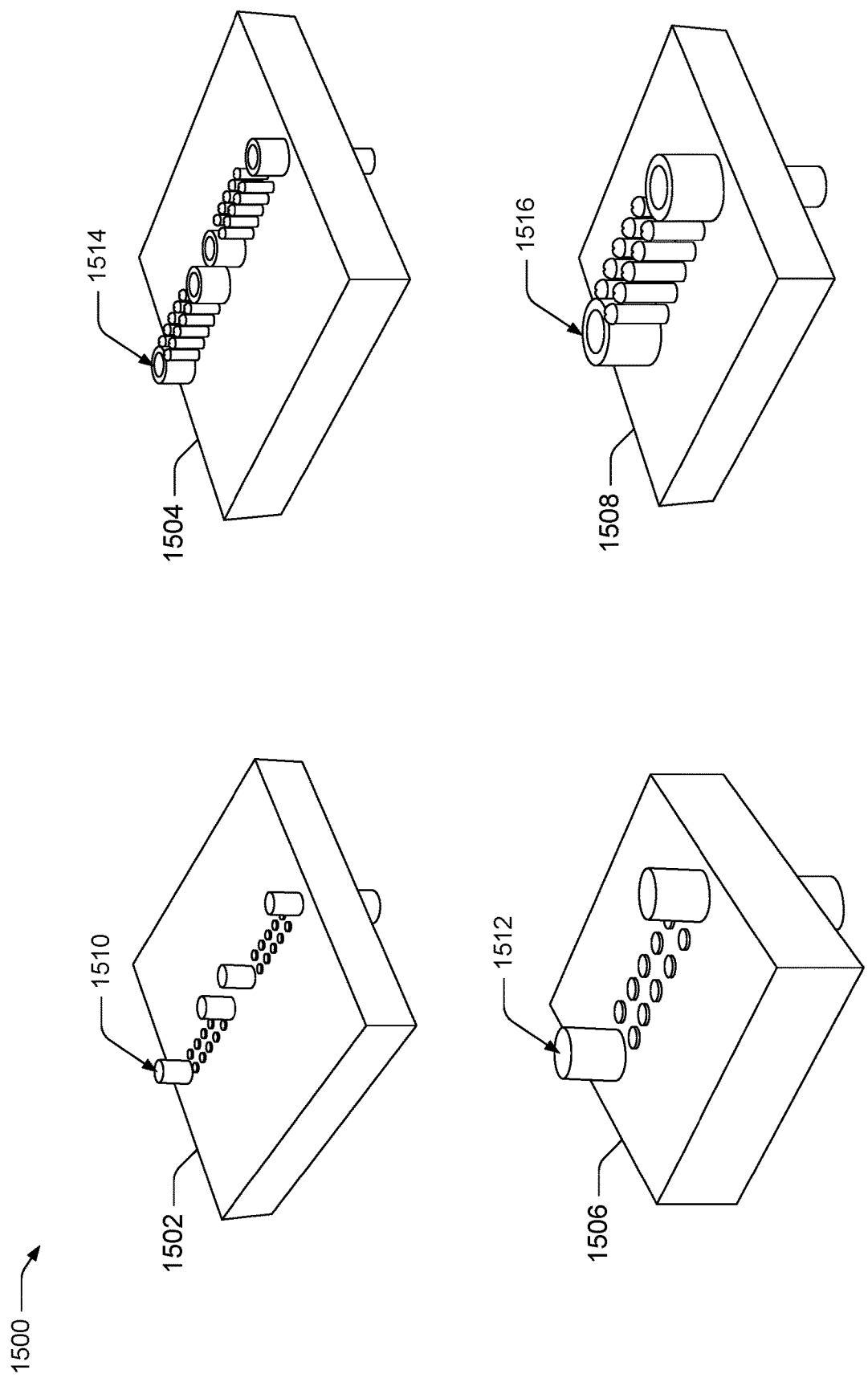
FIG. 15 is a diagram of example modules suitable for stacking to make an example stacked machine learning assembly, without discrete interconnection modules or adapters.

FIG. 15 shows additional implementations of various housings 1500 for the modules of an example machine learning assembly 200. The example modules 1502 & 1504 & 1506 & 1508 may be used for core modules 102, sensor modules 202, or other components in order to permit stacking with or without discrete interconnection modules 1100 & 1200 & 1300. Stacking without interconnection modules 1100 & 1200 & 1300 may be accomplished by creating male 1510 & 1512 and female 1514 & 1516 ports on the large major faces of the modules 1502 & 1504 & 1506 & 1508, so that the ports couple directly with each other when the modules are stacked.

Figure 16:
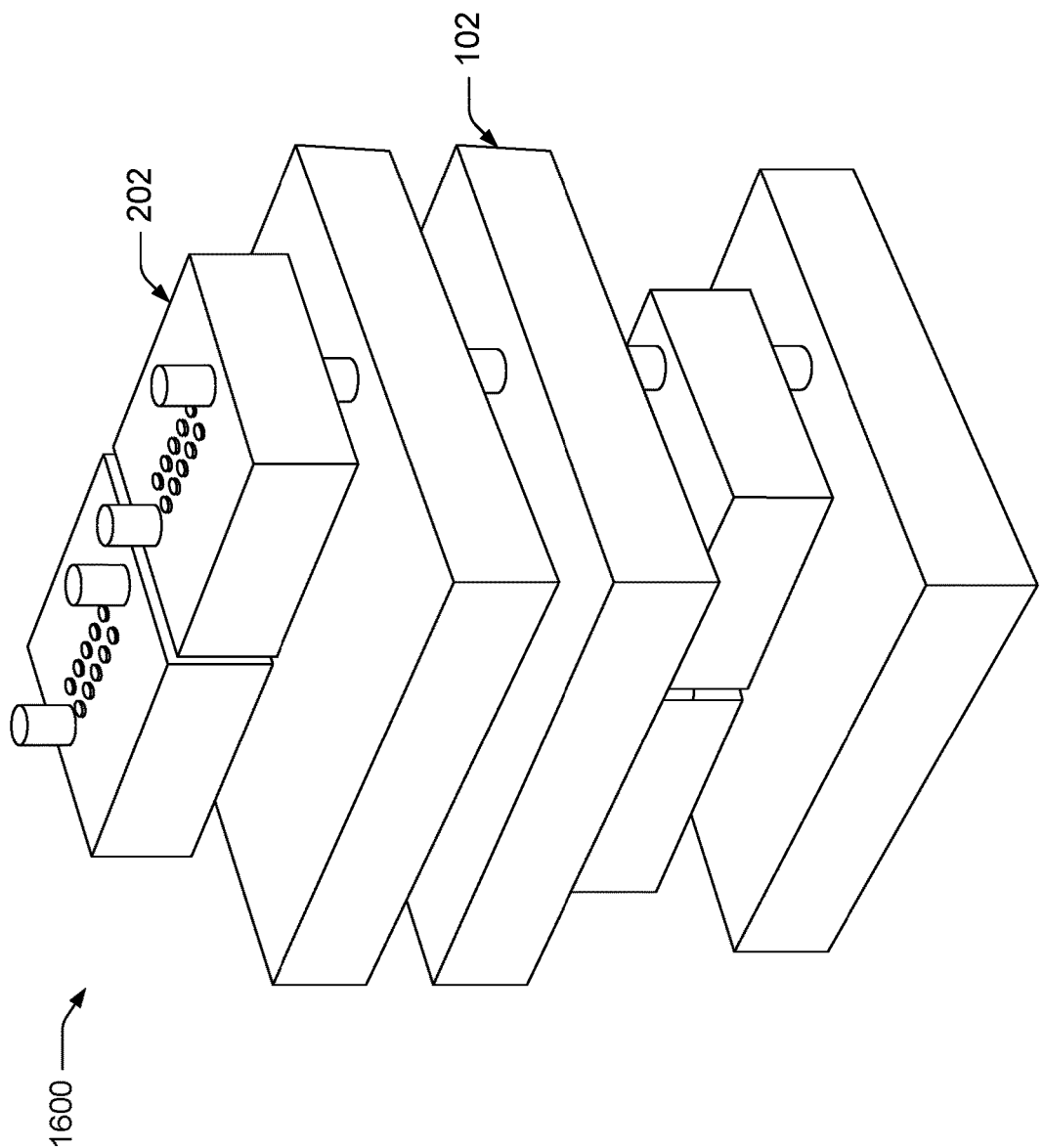
FIG. 16 is a diagram of an example stacked machine learning assembly, using the example modules of FIG. 15.

FIG. 16 shows an example machine learning assembly 1600 created by stacking, and thereby connecting various core modules 102 and sensor modules 202 without using interconnection modules 1100 & 1200 & 1300. The example machine learning assembly 1600 of FIG. 16 is stacked in one dimension, but the modules of the example machine learning assembly 1600 may also have ports, e.g., 806 & 808, on minor surfaces of the modules, thereby allowing structure assembly in more than one dimension.

Example Operations

Figure 17:
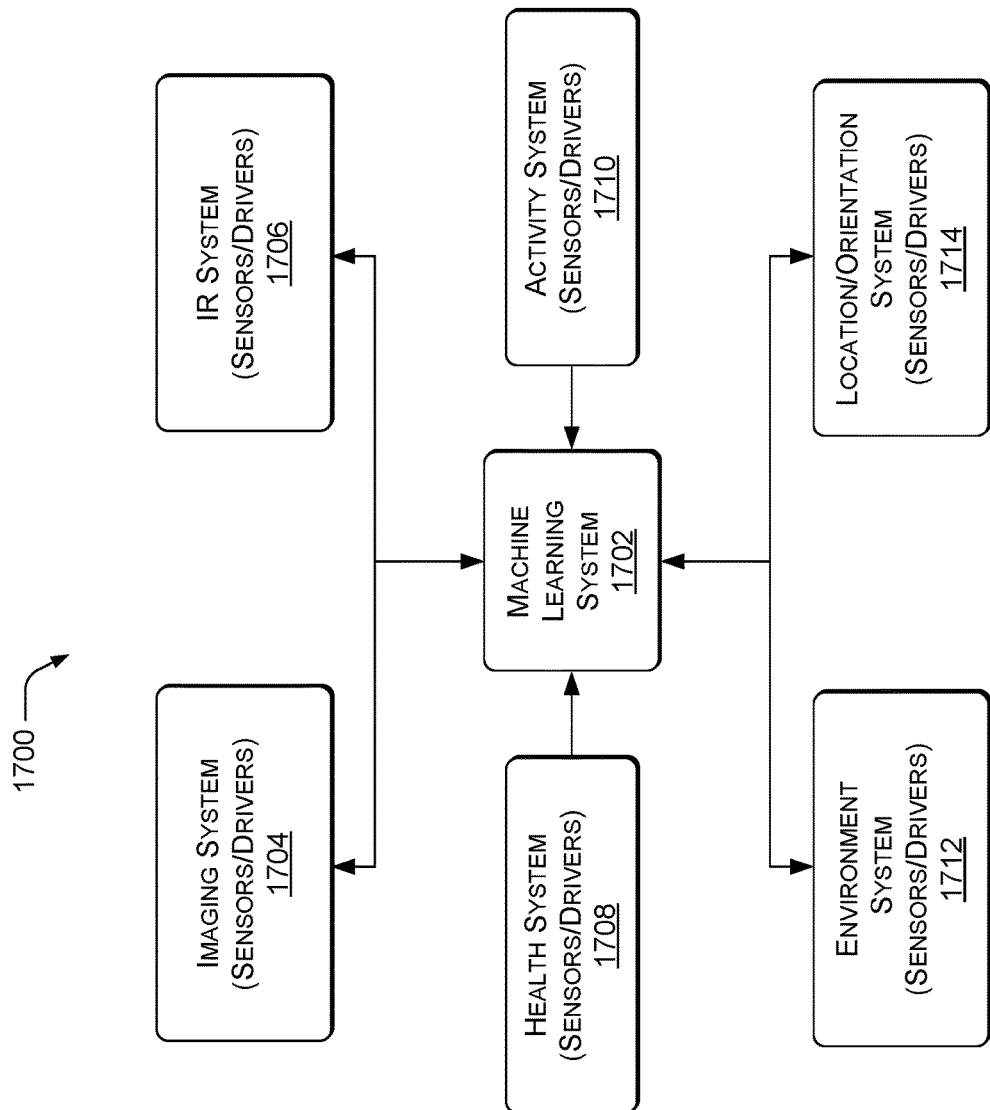
FIG. 17 is a block diagram of example machine learning system functionalities.

FIG. 17 shows a schematic of an example machine learning assembly 1700 or system. The example machine learning assembly 1700 may include a machine learning system 1702, embodied, for example, by at least one core module 102 containing at least one set of core components 500. The example system 1700 may also include one or more executive and sensing systems, each with its own sensors, drivers, actuators, and programming as needed, such as imaging system 1704, infrared sensor system 1706, health system 1708, activity system 1710, environment system 1712, and location/orientation system 1714, as examples.

Other components may include the power supply component or input 608, the memory component 504, data storage 506, and so forth. In certain implementations, the example machine learning assembly 1700 performs a machine learning function (or plurality of functions) without relying on computational support from remote computing resources, such as cloud connected server machines. Thus, the example machine learning assembly 1700 can operate independently of a computer network, such as the internet, external Wi-Fi, and so forth, although such functionality may be used for reporting on activity or for reconfiguring, maintaining, updating, and otherwise interacting with the example system 1700, for example through a user interface. The example machine learning assembly 1700 may send the results of processing the sensor(s) data 510 or the executive output 512 to a locally or remotely located machine, processor, data center, or server facility. The example machine learning assembly 1700 generally isolates the sensor data 510 within the system 1700. The example machine learning assembly 1700 may also keep the executive output 512 local and isolated within the example machine learning assembly 1700 or within the device hosting the example machine learning assembly 1700. Data output by the example machine learning assembly 1700 may be smaller than the data provided by one or more sensor modules 102 or sensor systems 1704-1714. Thus, data collected by the example machine learning assembly 1700 may also be discarded once processed. More specifically, data collected by a sensing module 202 may be discarded (e.g., deleted) after the example machine learning assembly 1700 processes the data.

At the heart of the example machine learning assembly 1700 is at least one machine learning kernel embodied in some of the example core components 500 (see examples in FIGS. 5-6). The example core components 500 may be surrounded by a housing, for example housing 700 or 800, and contain at least one component configured to perform at least one machine learning function. The machine learning function is understood by the skilled artisan to mean processing or interpreting information collected by a sensor, and self-learning to provide a useful output based on the processing or interpretation of the collected information. The artificial neural network 508 assists with the machine learning function.

The neural network 508 may be a system of programs, applications and/or data structures that simulate or approximate the behavior of artificial or biological neural networks. A neural network 508 may in some cases employ instructions written in a programming language to animate hardware used to modify the behavior of a machine or transform a physical property in the real world.

Many different types of neural networks 508 may be used in the example machine learning assembly 1700. Neural networks in general may involve a large number of processors operating in parallel, each with its own small sphere of knowledge and access to data in its local memory. However, in a preferred embodiment, an example neural network 508 used herein provides efficient and hardy machine learning, resulting in a low power consumption or low power demand on the machine learning system 1700. In addition to being more efficient, an example neural network 508 is more easily trained than conventional neural networks.

A neural network 508 to be utilized herein may be based on a mathematical model associated with a particular learning algorithm or learning rule. The example neural network 508 can be composed of a large number of highly interconnected processing elements (nodes) working in unison to solve a specific problem. An example node can be a device with many inputs and one output. In an implementation, the example node may have two modes of operation, a training mode and an operating mode. In the training mode, the node can self-train or be trained to detect particular input patterns. In the operating mode, when a learned input pattern is detected at the input, its associated output becomes the current output, subject to further iterations of the machine learning function within the example neural network 508.

An example machine-trained (MT) neural network 508 that may be used in some embodiments may utilize novel processing nodes with novel activation functions 610 that allow the MT neural network 508 to efficiently define a scenario with fewer processing node layers to solve a particular problem (e.g., face recognition, speech recognition, pattern recognition, and so forth). In some embodiments, the same activation function 610 is used for numerous processing nodes of the MT neural network 508, but through machine learning, the activation function 610 is configured differently for different processing nodes so that different nodes can emulate or implement two or more functions (e.g., two different periodic functions, two different logical Boolean operators, etc.), thereby accomplishing more with fewer nodes.

Each processing node in an example neural network 508 may have a linear component and a nonlinear component. The linear component of each processing node may implement a weighted sum 612 of the inputs to its processing node (e.g., a weighted sum of the outputs of the prior processing nodes from which the currently processing node receives). The nonlinear component of each processing node computes a function based on the output of the linear component. This function is an activation function 610.

The processing unit 502 controls and implements the example neural network 508. The term "processing unit 502" encompasses numerous types of apparatuses, devices, and machines for processing data, including by way of example a programmable processor 602, a computer, or multiple processors 602 or computers. The processing unit 502 can embody special purpose logic circuitry, e.g., an FPGA (field programmable gate array 604) or an ASIC (application-specific integrated circuit). The processing unit 502 and the memory 504 can be supplemented by, or incorporated in, special purpose logic circuitry. The processing unit 502 can also include, in addition to hardware, code that creates an execution environment for the computer program in question, e.g., code that constitutes processor firmware, a protocol stack, a database management system, an operating system, or a combination of one or more of these. The data storage medium 506 can be a machine-readable storage device, a machine-readable storage substrate, a random or serial access memory device, or a combination of one or more of these. In some embodiments, the processing unit 502 and memory 504 may be integrated into a single unit. Generally, the processing unit 502 receives instructions and data from a read only memory 504 or a random access memory 504 or both.

Sensors and other Components

According to one implementation, the example machine learning assembly 1700 may include one or more sensor modules 202 or sensor systems 1704-1714, each sensor module 202 or system 1704-1714 sensing an external quality, such as time, location, orientation, environment (liquid/gas), visible light, image, audio, video, IR/UV spectrum, pressure, temperature, volume, pH, speed, acceleration, vibration, GPS global position, heartbeat, blood pressure, machine status, game state, to name but a few. Sensors and/or software may be part of a sensor module 202 or sensing system 1704-1714. Sensed information may be converted to digital data via an analog-digital converter 606 and provided via electrical signal to the example core components 500.

The machine learning kernel embodied in the neural network 508 can process the digital data and in response, performs some physical or machine action, based on reporting the data, summarizing the data, modifying the data, and may also modify the machine learning model itself in response to the data. The core components 500 may process the digital data with no further input from outside the local machine learning assembly 200 or 1700, for example.

As an operational example, assume that a sensing system 1704 is an imaging system located in an automobile and has been trained to recognize pedestrians. Analog data is captured by the imaging system 1704 and sent to the example core components 500. The analog data is converted by an analog-digital converter 606 to digital data and sent to the processing unit 502. If the neural network 508 recognizes or learns a pattern that indicates the presence of a pedestrian near a travel path of the automobile, the executive output 512 is used to alert the driver that a pedestrian is nearby.

In an implementation, a sensing system 1704-1714 and other modular components of an example machine learning assembly 1700, including core modules 102 and interconnection components 1100 & 1200 & 1300, are altogether combined to result in a package on the order of one-quarter cubic inch in volume, or smaller. In an implementation, the efficiency of the implemented neural network 508 may consume power at a rate less of one watt of power on average.

The example machine learning assembly 1700 may be substantially enclosed or may have optional apertures (e.g., a perforated cover) to allow signal sensing, monitoring of environmental conditions, and permit the cooling of the core components 500, as examples. In an implementation, the example machine learning assembly 1700 may have a transparent cover such as glass, plastic or other suitable material to allow a user to inspect the example core components 500, interact through a image capturing component, perform flash programming, and so forth.

In an implementation, the auto-detector 626 determines that a particular sensing system 1704-1714 or other component has become connected or disconnected to the example machine learning assembly 1700. The function and data-type parser 628 may auto-identify the functionality and data protocol that will be provided to or from a particular newly connected sensing system 1704-1714, sensor module 202, or other component. For example, a user may initially couple an image sensor 1704 to the example machine learning assembly 1700, but later decide to instead couple, or additionally couple, a temperature sensor, gas sensor, etc., to the example machine learning assembly 1700. The example machine learning assembly 1700 is configured to recognize that the data is new data and the parser 628 can determine what to do with the new incoming data 510. The parser 628 can use known detection techniques, such as identification codes 624 or similar measures. The appropriate weights 612 and/or activation functions 610 to apply to nodes of the neural network 508 to represent input from each type of sensing system 1704-1714 can be stored in memory 504 and applied to the neural network 508 as the particular sensing system 1704-1714 is detected and recognized. For example, if a gas sensor is added to an image sensor 1704, the machine learning assembly 1700 may recognize that the system should monitor ambient gas conditions when humans are present, but not when robots are present and may utilize this information to make a decision, report on the conditions, and so forth. Alternatively, if the image sensor 1704 is removed and the gas sensor is added, the example machine learning assembly 1700 recognizes that the system should optimize ambient gas conditions based on undesired deviations in the ambient gas conditions, for example.

Example Method

Figure 18:
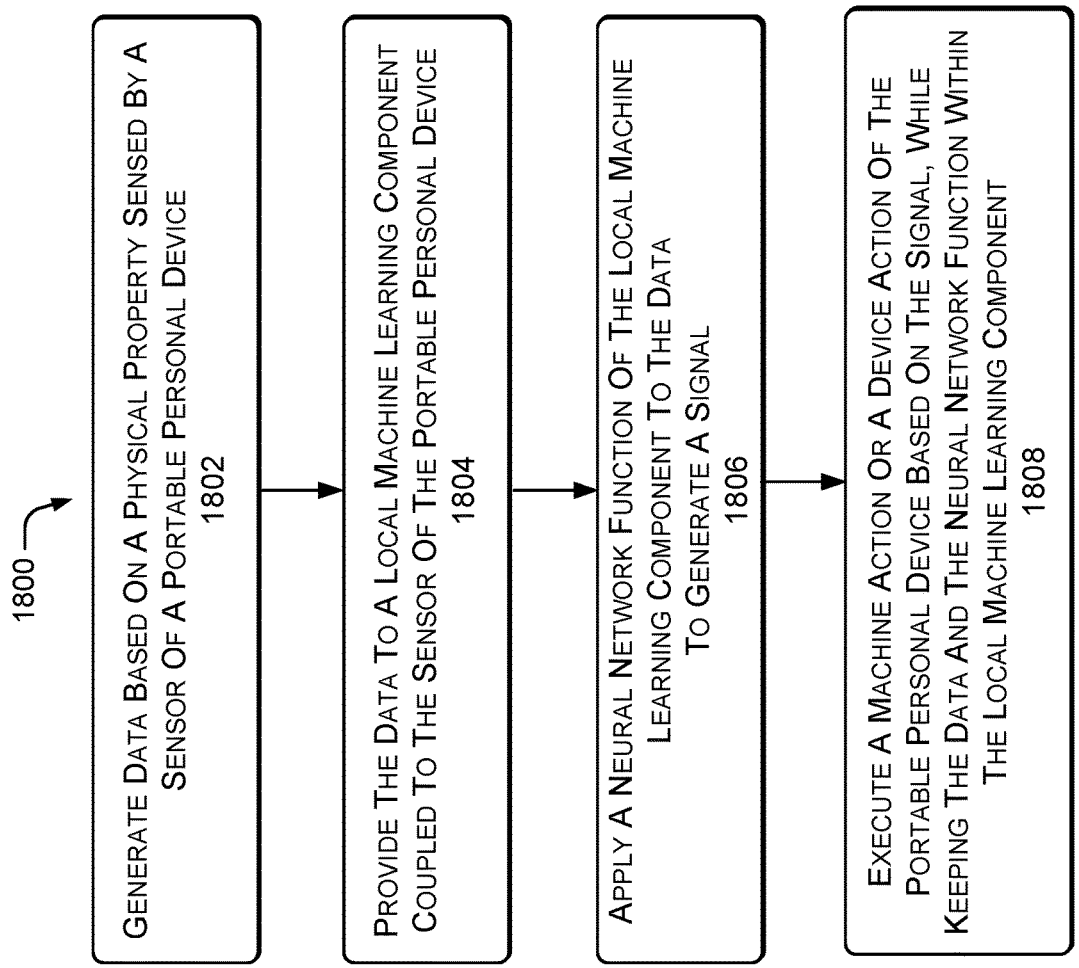
FIG. 18 is a flow diagram of an example method of autonomously operating a configurable machine learning assembly in a portable personal device.

FIG. 18 shows an example method 1800 of autonomously operating a configurable machine learning assembly in a portable personal device. In the block diagram of FIG. 18, operations are shown in individual blocks. The example method may be performed by hardware, such as by an example machine learning assembly 200 containing an example core module 102 and further containing at least one set of example core components 500.

At block 1802, data based on a physical property is sensed by a sensor of a portable personal device.

At block 1804, the data is provided to a local machine learning component coupled to the sensor of the portable personal device.

At block 1806, a neural network function of the local machine learning component is applied to the data to generate a signal.

At block 1808, a machine action or a device action of the portable personal device is executed based on the signal, while the data and the neural network function are kept within the local machine learning component.

Example Methods of Making Smart Modules with Contactors

Figure 19:
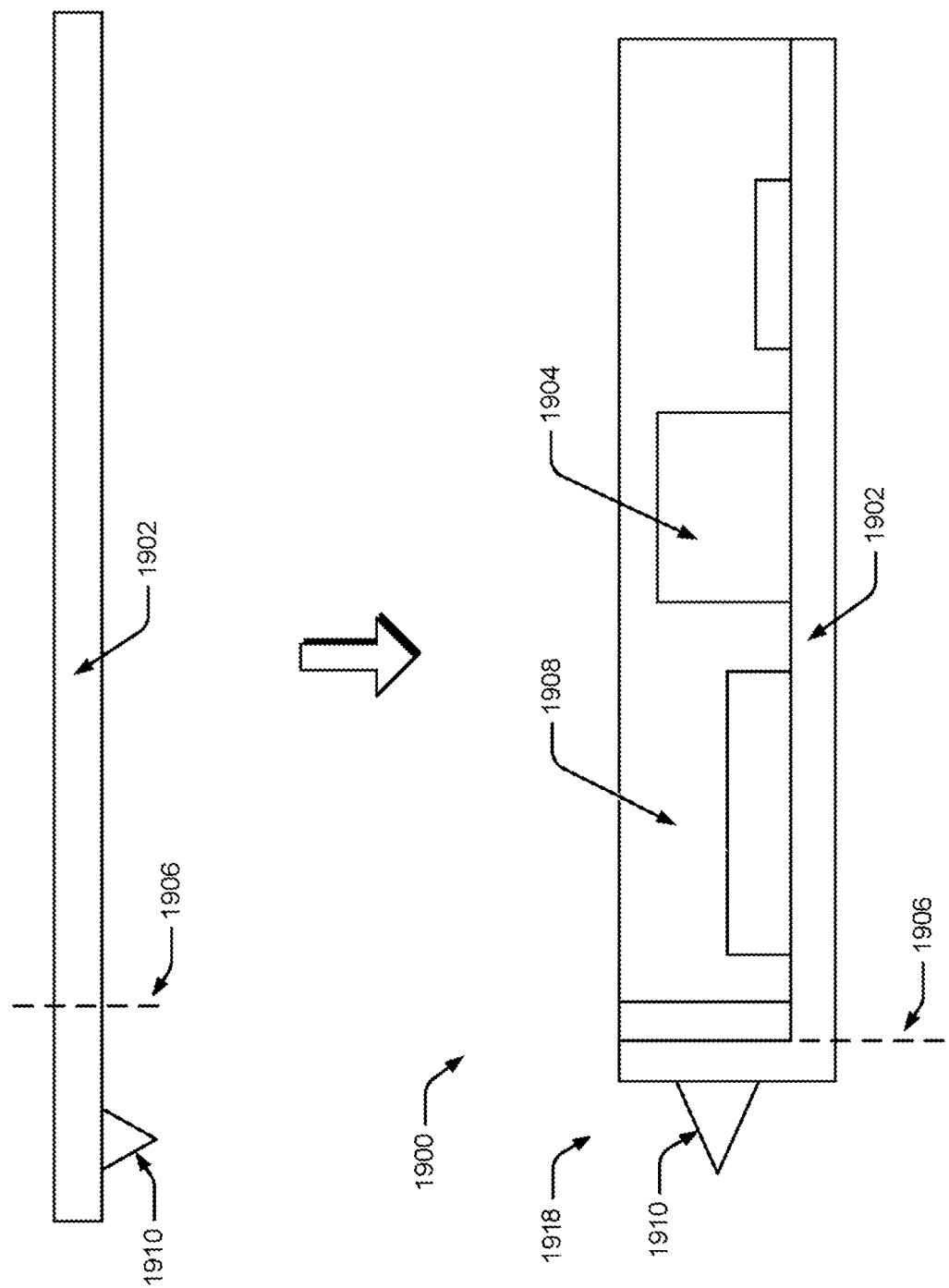
FIG. 19 is a diagram of an example module of an example configurable machine learning assembly of a smart object system.

FIG. 19 shows an example module 1900 of a smart object system, such as the example smart object system described with respect to previous FIGS. 1-18. The example module 1900 supports artificial intelligence (AI) microelectronics, such as a machine learning component or an artificial neural network component or collection of components, for example. The example module 1900 provides one "building block" of the configurable smart object system, which may consist of various different modules connected to each other through identical or complementary physical and electronic interfaces and pinouts, such as the example purposed port 706, to form larger configurable smart object systems. An example customized and configured smart object system, in turn, is made of a custom collection of such modules 1900 connected together, and brings artificial intelligence (AI), such as machine learning or an artificial neural network, to everyday devices, with the goal of adding a degree of artificial intelligence (AI) to the everyday device in a closed system that does not need to consult outside itself to make intelligent decisions, nor rely on outside resources for computing power or analysis of data.

The example module 1900 includes a substrate 1902 and an attached machine-learning or artificial intelligence (AI) element 1904 of a configurable machine learning assembly, such as those described in FIGS. 1-18, for example. The machine-learning AI element 1904 may include one or more components, or all the components, of the example core components 500 shown in FIGS. 5-6, for example. The machine-learning AI element 1904 is mounted or assembled on the substrate 1902. In an implementation, the substrate 1902 is foldable with at least one fold line or "fold" 1906 in the substrate that enables the substrate 1902 to be folded into the form of an outer housing of the module 1900 of the configurable machine learning assembly. A molding material 1908 can at least partially fill the module 1900 of the configurable machine learning assembly. The molding material 1908 or filler may be applied in one or more pieces or deposits to at least the substrate 1902 before or after the folding of the substrate 1902.

In an implementation, before a flat version of the substrate 1902 is folded into the module 1900, contactors 1910 are also fabricated on a side of the flat substrate 1902 to make the interface 1918 that will be identical or complementary among all modules 1900 to be used in a given smart object system. The contactors 1910 may include pinouts and connectors for power, ground, and signal connections, and for physically connecting, sequencing, and "chaining" modules 1900 together. An example interface 706 is shown in FIG. 7, for example. In an implementation, a combination of male and female contactors 1910 may be disposed near an edge of the substrate 1902, to be folded into one of the sides of the module 1900. Further examples of such contactors 1910 and connectors are shown in FIGS. 7-16, for example.

Each contactor 1910 provides a physical or an electrical contact between the module 1900 and another module of the smart object system, or between the example module 1900 and a motherboard, a power connector, a data connector, a machine, a device, an appliance, or a computer, for example.

In an implementation, the molding material 1908 is optional. The molding material 1908 can be applied in various ways to the substrate 1902, which is then folded to become the housing of the module 1900. Or, the substrate 1902 can be folded first, and the resulting housing filled, or partially filled, with the molding material 1908.

The artificial intelligence (AI) element 1904 of the configurable machine learning assembly can be a machine learning circuit, a machine learning core, a neural network, or any component related to the machine-learning component or the artificial neural network component, including a chip, a semiconductor, an integrated circuit, a metallic conductor, a discrete electronic component, a sensor, a controller, an indicator, an output device, an actuator, an interface member, an adapter member, a connector, a processor, a memory element, a data storage medium, a battery, a driver, a transmitter, or a user interface related to the machine-learning component or the artificial neural network component.

In an implementation, the module 1900 may include an opening in the folded housing for exposing a MEMS element, an optical sensor, a sound sensor, an environmental sensor, or an actuator.

Figure 20:
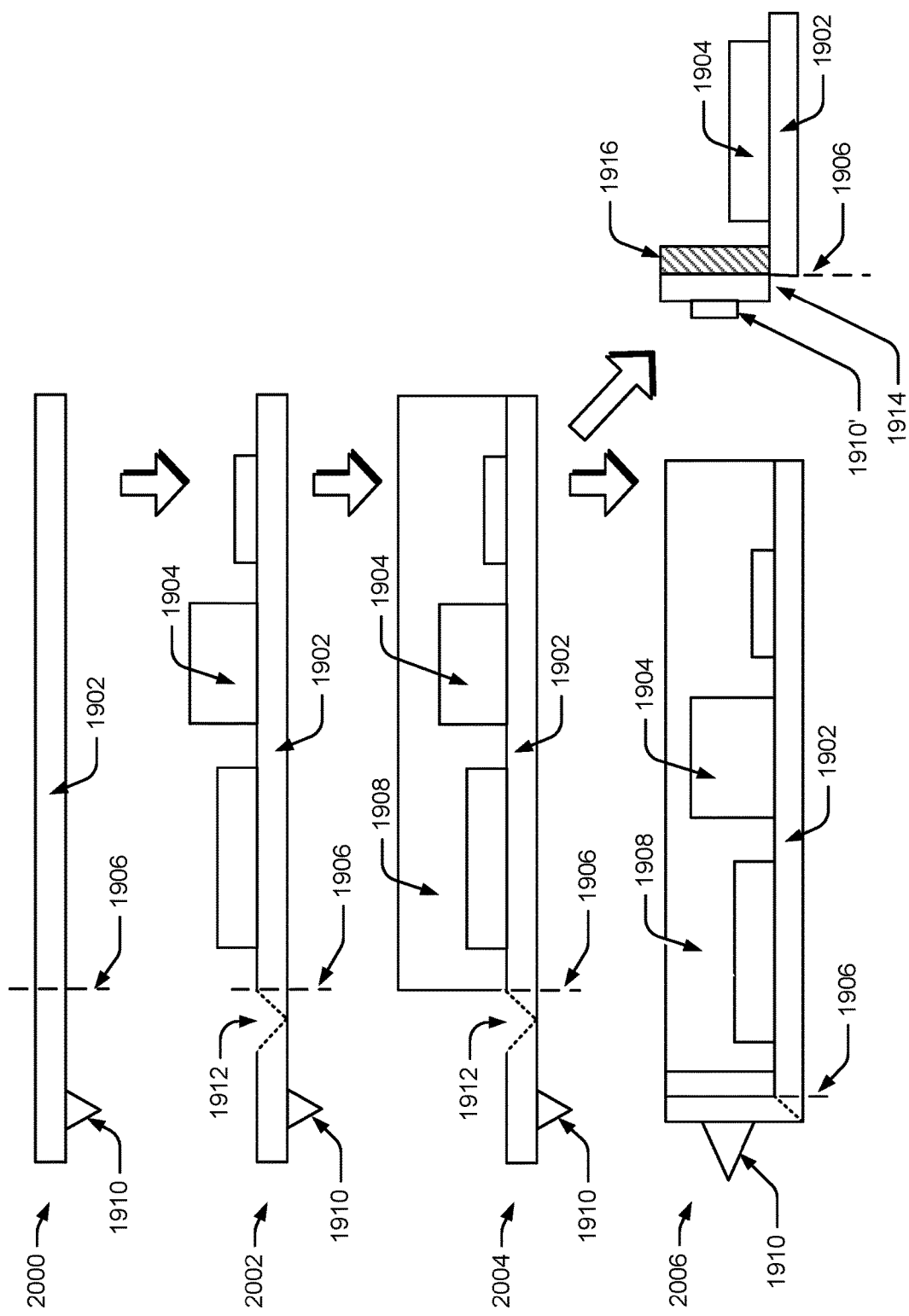
FIG. 20 is a diagram of an example construction sequence for making an example module.

FIG. 20 shows an example construction sequence for making an example module 1900. In a first step 2000, contactors 1910 enabling the module 1900 to interface outside itself are fabricated on the substrate 1902, which may be a panel form or laminate, such as an acrylic-based laminate or bondply, for example. More generally, the substrate 1902 may be made of a printed-circuit-board (PCB) material, glass, epoxy, a composite, FR-4, a plastic, a polymer sheet, a glass-reinforced epoxy laminate sheet, woven fiberglass cloth with epoxy resin binder, and so forth. An example substrate 1902 may be acrylic-based with polyimide film in sheet form with single or double-sided clads, and can be in a wide range of thicknesses. Laminated composites can utilize flexible, rigid-flex, or all-flexible multilayer constructions. Construction of the contactors 1910 may be made integral, with the contactors 1910 made as part of the substrate 1902 or other board being used. The contactors 1910 may also be devised with a compliant material 1916 to allow some play in the contacting action of the contactors 1910 with other modules of the smart object system via identical or complementary interfaces.

In a second step 2002, chips are added or assembled on the substrate 1902, such as AI element 1904 and other microelectronics to be added, while the substrate 1902 is still flat and unfolded. Initial preparation for folding the substrate 1902 may be initiated by making a notch 1912 in the substrate 1902 at a future fold line 1906. In some cases, the substrate 1902 may be thin enough or flexible enough to not require a notch 1912 for folding. In other circumstances, the substrate 1902 may be folded leaving an external notch 1914, which may be left as is or finished with exterior molding material 1908.

At step 2004, a molding material 1908 or filler may be added at this point, but may also be added after folding the substrate 1902 in a subsequent step. The molding material 1908 is optional, but adds stability and durability to the module 1900, which may be used in a smart object system to be used in mobile devices that undergo physical shocks, such as being dropped, or in appliances subject to shock and vibration. The molding material 1908 also seals the components in the finished module 1900, and waterproofs the contents, making them airtight, when needed. In an implementation, types of molding material 1908 may also dissipate heat when the module 1900 contains very active or heat-producing microelectronics.

At step 2006, before or after adding the optional molding 1908, the substrate 1902 may be folded at one or more fold lines 1906. For example, the substrate 1902 may be folded 90 degrees on a fold line 1906 to create a side of the module 1900. The contactors 1910 can be on any of the sides, including a folded side or an unfolded side, and contactors 1910 can also be placed on multiple different sides of the module 1900.

Different styles of the example module 1900 may have different but comparable features, such as different shapes and types of contactors 1910'. Sides of the example module 1900 may be formed without folding, for example, by building a housing with separate pieces of substrate 1902, with resulting edge spaces 1914 filled in with molding material 1908, for example, or left open. A compliant backing layer 1916 may be added to, or behind, the contactors 1910' to create contact pressure when the contactors 1910' make an electrical connection.

Figure 21:
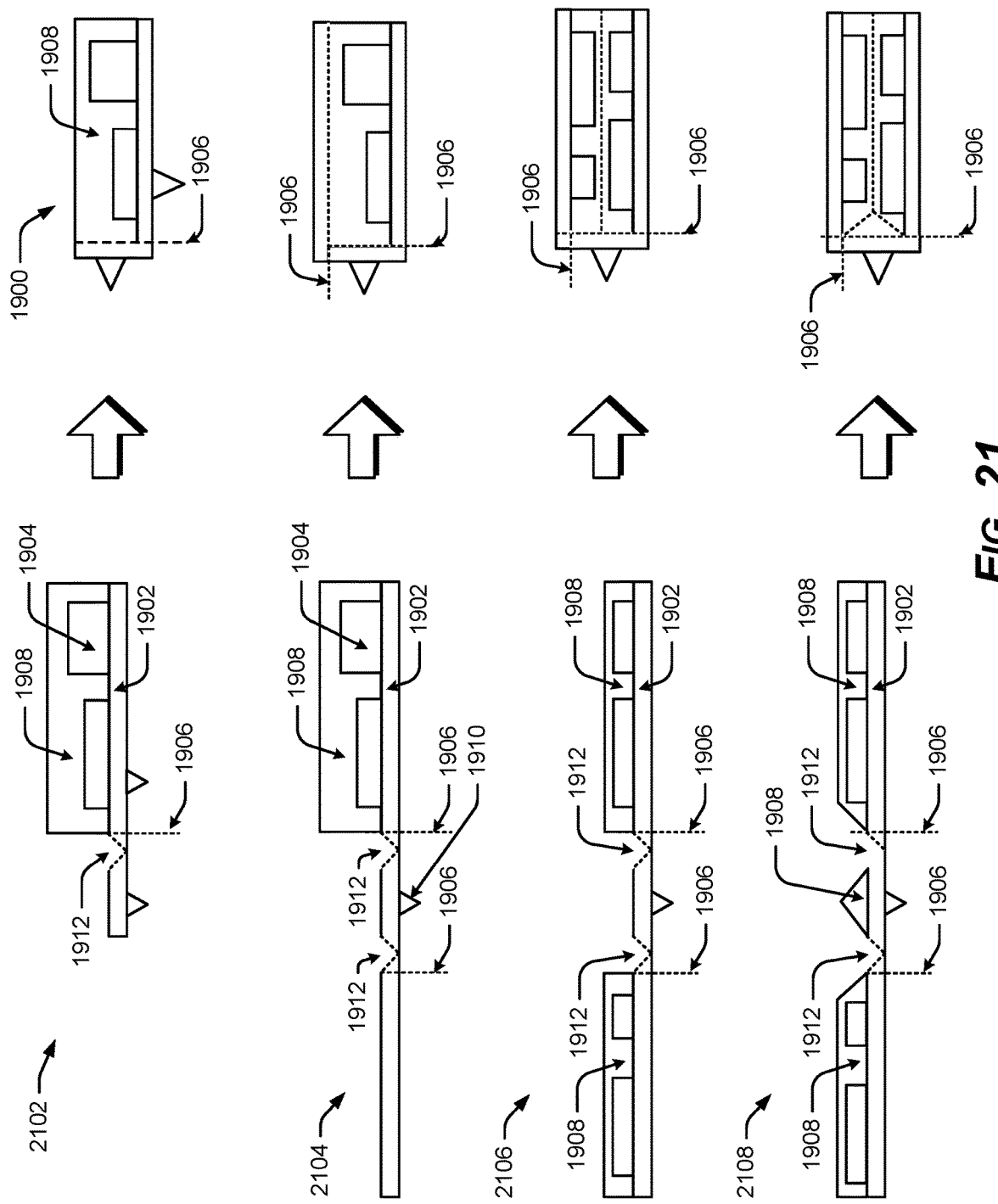
FIG. 21 is a diagram of different folding operations, with various substrate folding possibilities to make an example module of the smart object system.

FIG. 21 shows different folding operations, with various substrate folding possibilities to make an example module 1900 of the smart object system. The scenarios shown in FIG. 21 show the addition of optional molding material 1908 to the substrate 1902 before folding operations. Molding material 1908 may be added after the folding operations, in other implementations.

In a first example folding operation 2102, the optional molding material 1908 is placed prior to folding, and the part of the substrate 1902 that hosts an interface, including contactors 1910, is folded up to make an exterior housing along a fold line 1906. In an alternative process, the substrate 1902 is folded first, and then the molding material 1908 is placed after folding to fill in the housing made by folding the substrate 1902.

A second example folding operation 2104 folds a substrate with multiple fold lines 1906 to form a housing with bottom, top, and one or more sides. The contactors 1910 may reside on one or more of these sides. The molding material 1908 is applied before the folding of the substrate 1902, in a manner that will substantially fill the entire volume of the housing, once the substrate 1902 is folded. The substrate 1902 is then folded around the pre-placed molding material 1908, and contacts the molding material 1908 on every side that is folded to make the housing of the example module 1900.

A third example folding operation 2106 applies molding material 1908 to the substrate 1902 before the substrate 1902 is folded, however the molding material is filled to only one-half of the future finished height of the folded housing. When the substrate 1902 is folded, the tops of the applied molding material 1908 meet in the middle of the folded housing to completely fill the space inside the example module 1900.

A fourth example folding operation 2108 is similar to the third example folding operation 2106 above, except that the molding material 1908 is mitered to assist the folding and the meeting of the surfaces of multiple instances of the molding material 1908 applied to the substrate 1902. The mitered shape of the molding compound 1908 with at least some 45 degree sides can also be more forgiving during application of the molding material 1908 and can assist with alignment of top and bottom halves of the module 1900, or can assist with forming corners and sides that are folded more precisely at 90 degree from each other. In other implementations, mitered molding material 1908 may use various different fold lines 1906 and angles for making a different numbers of sides of the module 1900 from a flat substrate 1902.

The folded sides of the modules 1900 can be secured to the molding material 1908 with an adhesive, or can be secured by the molding material 1908 itself when the molding material 1908 is self-adhesive.

Figure 22:
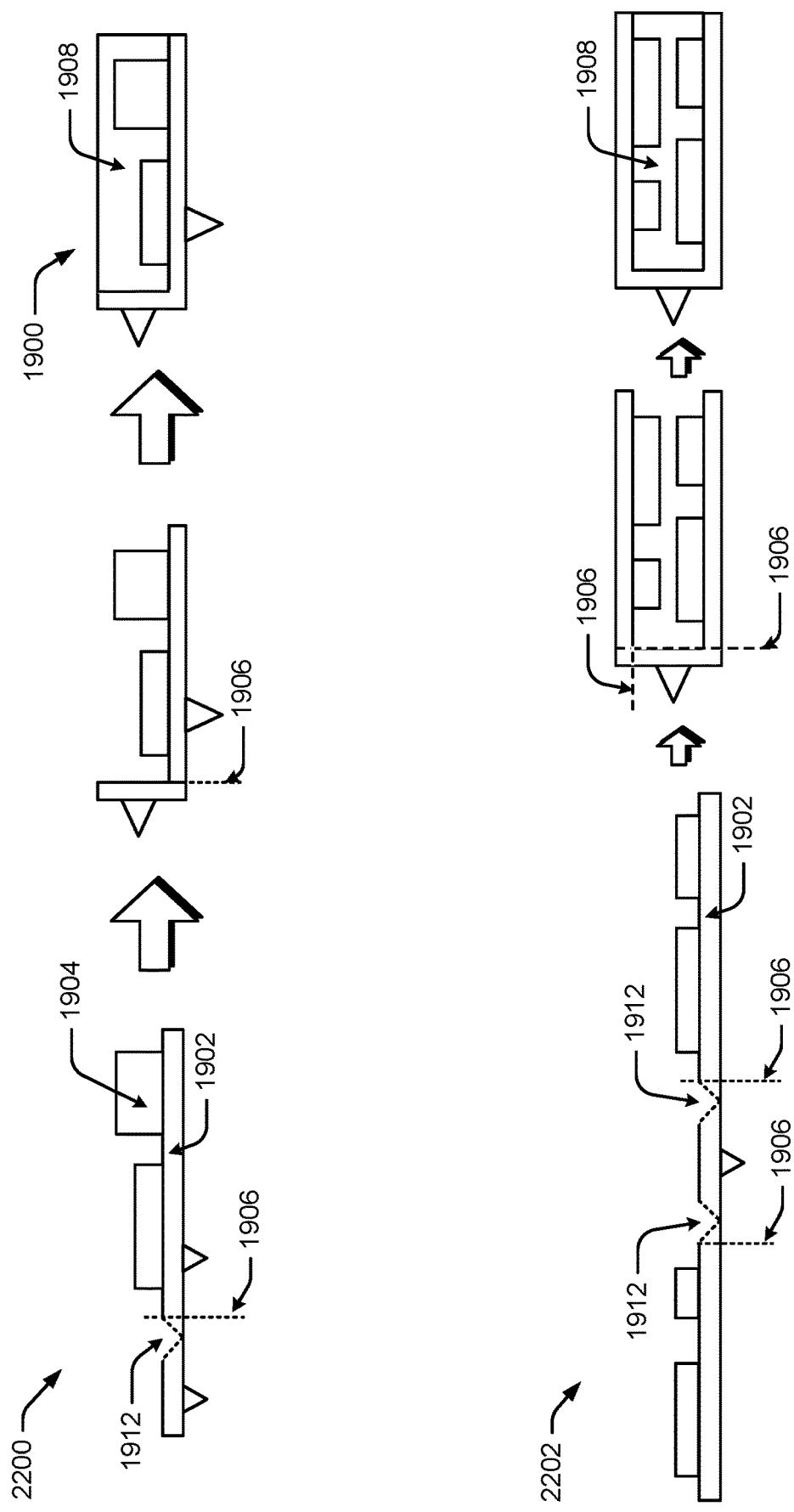
FIG. 22 is a diagram of example folding processes in which a molding material is added to the housing formed by a substrate, after the substrate is folded.

FIG. 22 shows example folding processes 2200 & 2202 in which the molding material 1908 is added to the housing formed by the substrate 1902 after the substrate 1902 is folded. In 2200, a single side is folded at 90 degrees from the horizontal plane of the unfolded substrate 1902, and then molding material 1908 is added to fill in the volume formed. In 2202, a substrate 1902 and chips 1904 attached to multiple potential sides are folded into a housing of the module 1900, and then molding material is applied or injected after the folding of the substrate 1902.

Figure 23:
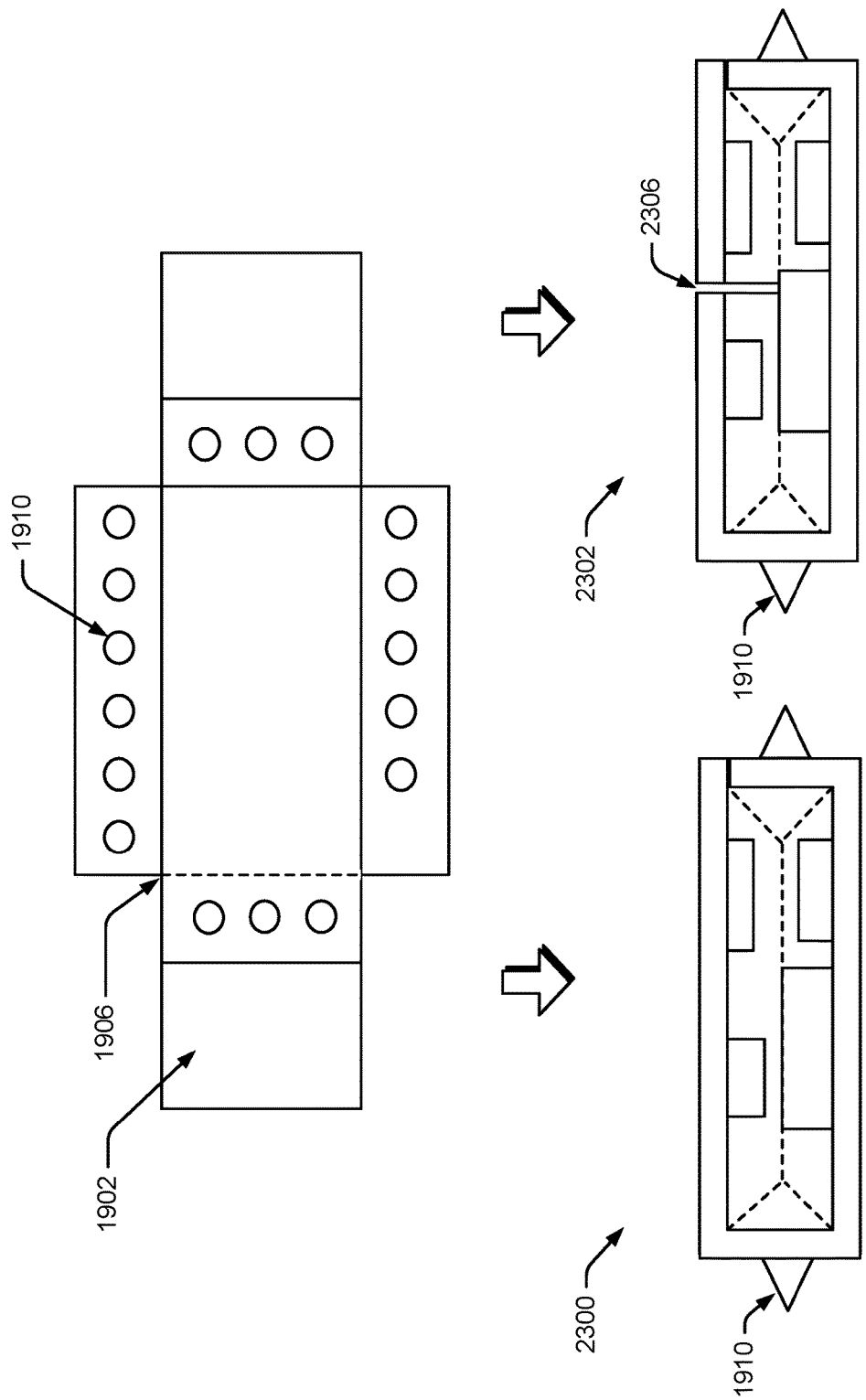
FIG. 23 is a diagram of example constructions, including a planar substrate with folds to make all six sides of an example module.

FIG. 23 shows example constructions 2300 & 2302, including a planar substrate 1902 with folds 1906 to make all six sides of a module 1900 in the shape of a rectangular solid. In 2302, the rectangular solid shape of the example module 1900 includes an opening 2306 or window for accessing interior components of the module 1900, or for the interior components (for example, a sensor) to access the outside environment.

Figure 24:
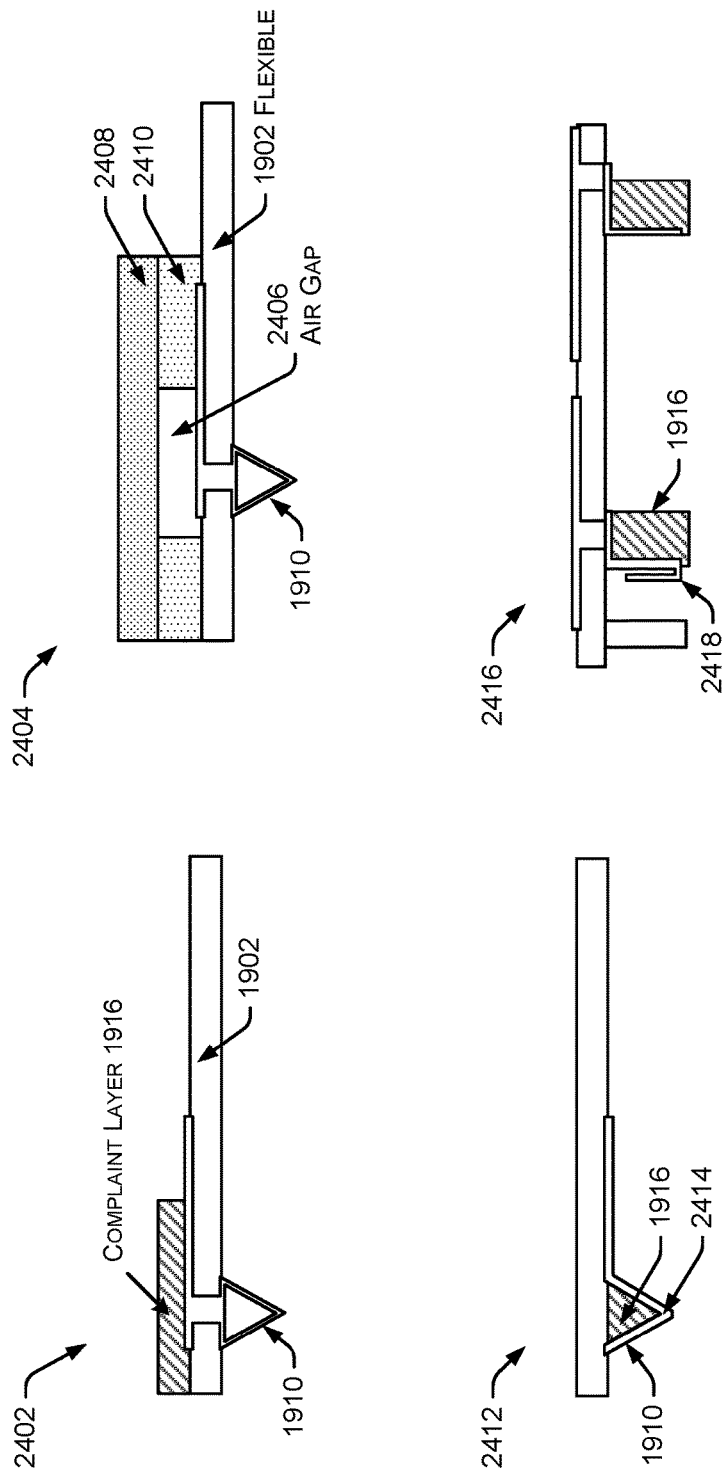
FIG. 24 is a diagram showing various ways of making an example contactor, which can be partly composed of, or backed by, a compliant material.

FIG. 24 shows various ways of making an example contactor 1910, which can be partly composed of, or backed by, a compliant material 1916. The compliant material 1916 as a layer or backing applies a contact pressure to the contactors 1910 for making good electrical connections, and also allows some "give" between a contactor 1910 and a conductive surface or receiving receptacle to be contacted by the contactor 1910, when the contact is being made and alignment may not be perfect yet. The compliant layer or backing may be a flexible material, a compressible material or mechanism, or a compressible air gap, for example. The compliancy of the contactors 1910 allows the contactors 1910 to mate with a complementary interface of another module with some tolerance for misalignment until the mating is complete. Then, the compliancy provides some contact pressure between conductive contacts and the contactors 1910, so that the contactors 1910 make a good electrical connection at the interface.

In an implementation 2402 of the contactor 1910, the compliant material 1916 is placed within the housing formed by the substrate 1902, and the side of the housing formed by the substrate 1902 is allowed some movement, to enable some compliancy when the contactor 1910 is making contact with a complementary contactor of another module of the smart object system. The contactor 1910 may also be seated directly on the compliant material 1916 through a hole (not shown) in the substrate 1902, in which case the housing formed by the substrate 1902 can be perfectly rigid, while the contactor 1910 is afforded some compliancy by the compliant material 1916 through the hole.

In another implementation 2404, an air gap 2406 in the construction of the housing formed by the substrate 1902 of the module 1900 and other solid supports 2408 and surfaces 2410 provides compliancy for the contactor 1910.

In yet another implementation 2412, the contactor itself 1910 is made at least in part of the compliant material 1916, and then covered, plated, or clad with a conductive outer layer 2414 for making electrical contacts.

In yet another implementation 2416, a different style of contactor 1910 may achieve compliancy by a resilient spring shape 2418 of the conductive contactor 1910, and the compliancy may be increased by horizontally abutting an adjacent stub or pillar of compliant material 1916.

Figure 25:
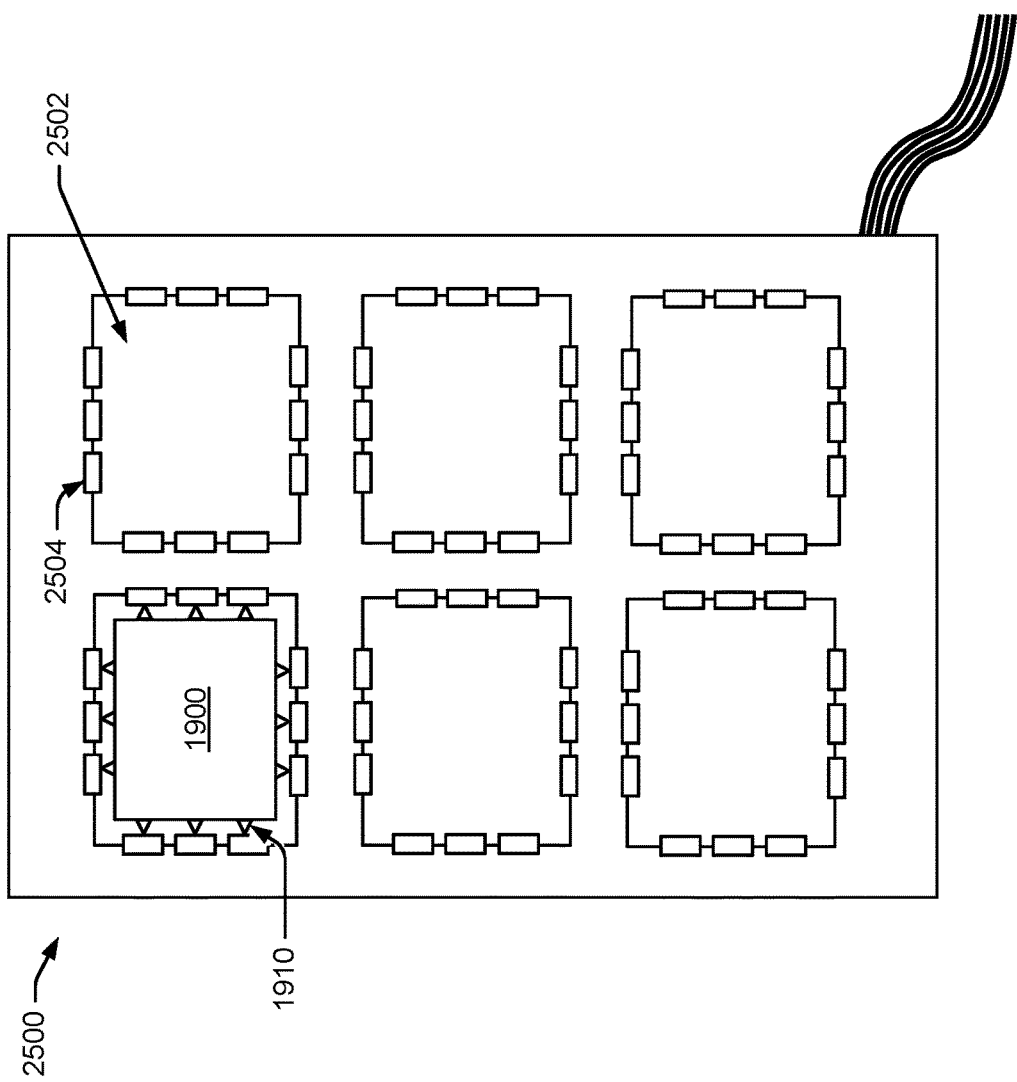
FIG. 25 is a diagram of an example connector framework and interface system for plugging-in various example modules of the smart object system.

FIG. 25 shows an example connector framework and interface system 2500 with sockets 2502 and interface connectors 2504 for assembling a configurable smart object system by plugging-in various example modules 1900 of the smart object system, such as those shown and described in FIGS. 19-24. The interface system 2500 provides a framework of connectors for organizing and interconnecting various modules 1900 of the smart object system together with each other, and with a motherboard, machine, device, or appliance, for example, which may be hosting the example interface system 2500.

The interface system 2500 may provide a common bus between interfaces of multiple modules 1900, as a way of breadboarding the example modules 1900 into a customized smart object system, or the interface system 2500 may have custom or configurable hardwiring between the various sockets 2502 and connectors 2504. Each socket may accept an example module 1900 that has contactors 1910 forming a compatible interface on one side of the module 1900, or on two, three, four, five, or even six sides of the example module 1900. In an implementation, the example interface system 2500 has a lid (not shown) with interfaces for engaging the tops of the example modules 1900, totally enclosing the inserted modules 1900 when the lid is closed and secured.

Figure 26:
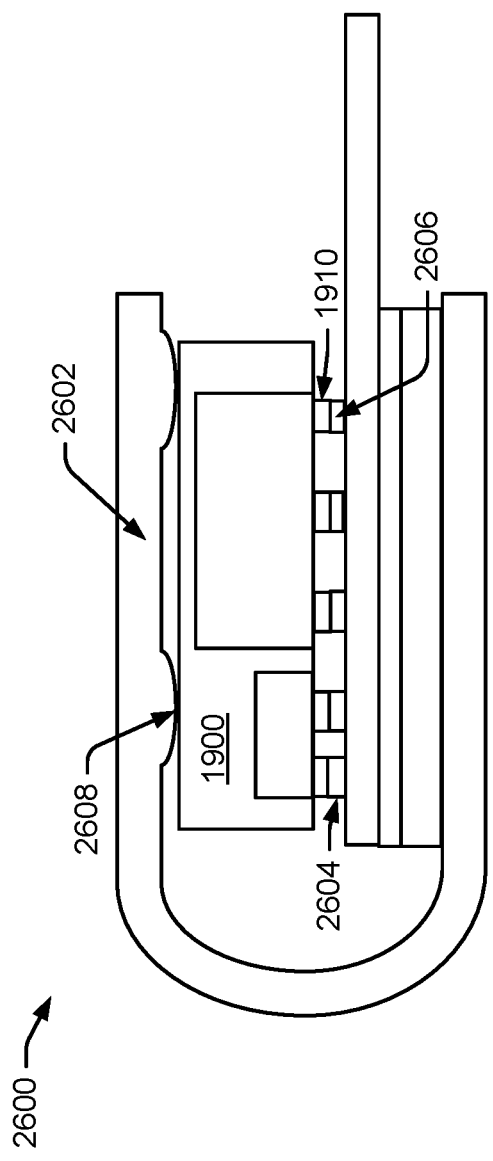
FIG. 26 is a diagram of another example compatible interface comprising a clip connector for an example module of the example machine learning assembly.

FIG. 26 shows another example compatible interface for the example module 1900 of the machine learning assembly. Modules 1900 of the smart object system may interface with each other, but may also interface with a motherboard, machine, device, or appliance through connectors, sockets, and other types of coupling mechanisms.

In FIG. 26, an example clip connector 2600 has a resilient clip 2602 to hold the example module 1900 in place in the clip connector 2600 for connection with a motherboard, machine, device, or appliance through an interface 2604 of the clip connector 2600 that has a pinout or contacts 2606 compatible with the contactors 1910 of the example module 1900. The resilient clip 2602 may have enough spring to apply contact pressure to the example module 1900, for holding the module 1900 in the clip connector 2600, and for making good electrical connections between the contactors 1910 of the module 1900 and the contacts 2606 of the interface 2604 of the clip connector 2600. In an implementation, the resilient clip 2602 of the clip connector 2600 may have one or more detents 2608 to prevent the module 1900 from moving in the clip connector 2600 until released. The example module 1900 may have complementary divets or detents to match the detents 2608 of the clip connector 2600.

In an implementation, the example module 1900 and complementary clip connector 2600 may have contactors 1910 and contacts 2606 that physically hold the module 1900 in place, until manually removed from the clip connector 2600. The interfaces and ports 706 shown in FIGS. 1-18, for example, may physically hold a module 1900 in place when connected to an interface external to itself.

Figure 27:
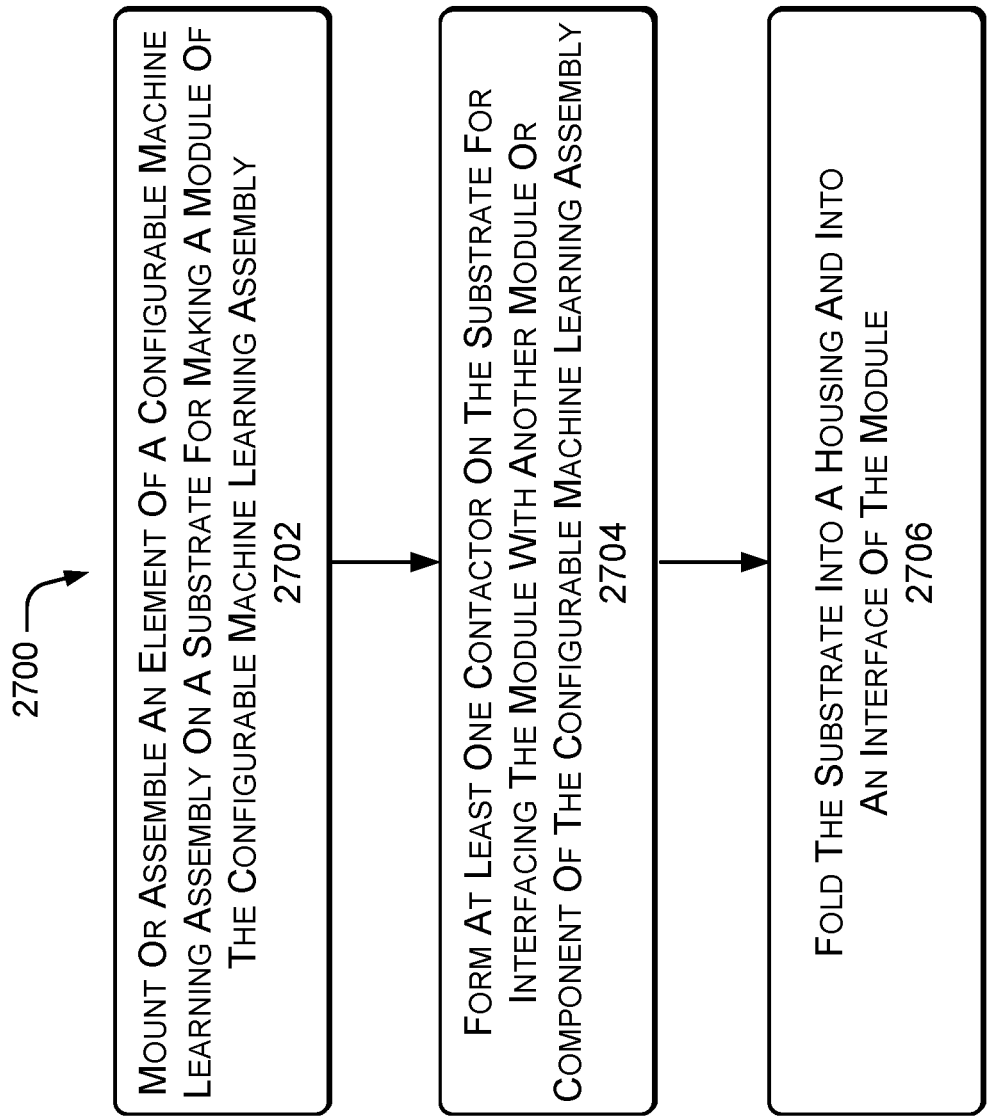
FIG. 27 is a flow diagram of an example process of constructing a module for a machine learning assembly of the example smart object system.

FIG. 27 shows an example method 2700 of constructing a module for a machine learning assembly. In the flow diagram, operations of the example method 2700 are shown as individual blocks.

At block 2702, an element of a configurable machine learning assembly is mounted or assembled on a substrate for making a module of the configurable machine learning assembly.

At block 2704, at least one contactor is formed on the substrate, each contactor for interfacing the module with another module or another component of the configurable machine learning assembly.

At block 2706, the substrate is folded into a housing and into an interface of the module of the configurable machine learning assembly.

An optional molding material may be added to the housing to at least partially fill the module of the configurable machine learning assembly. The molding material may be placed on the substrate and components, before or after folding the substrate into the housing of the module.

Figure 28:
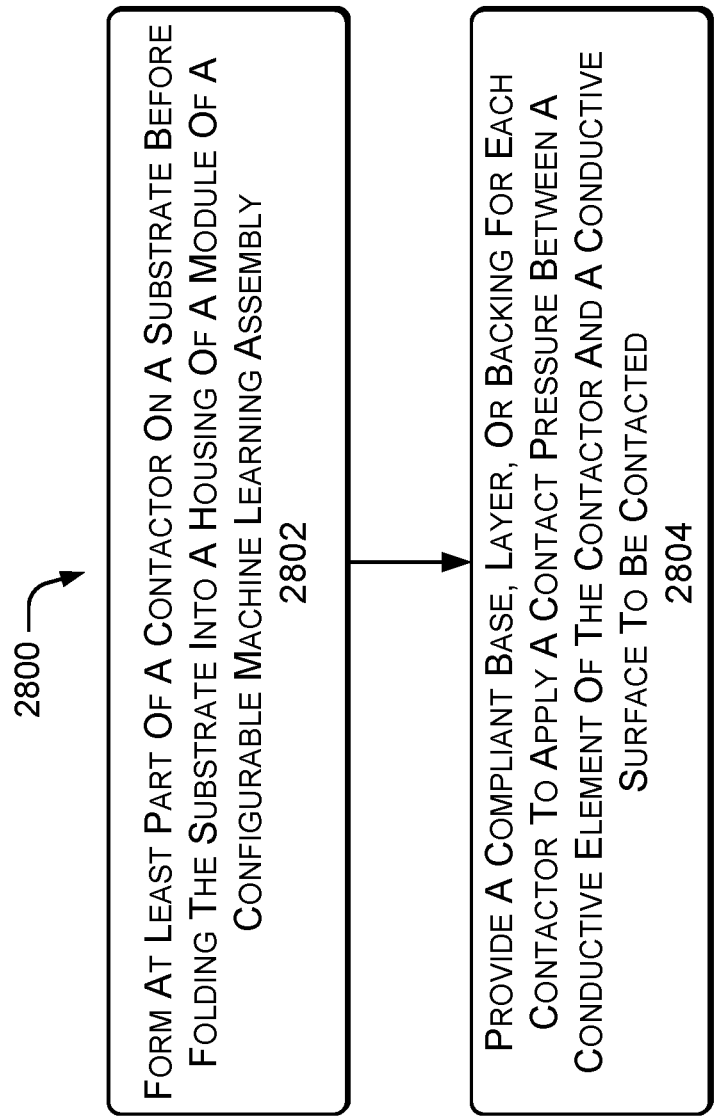
FIG. 28 is a flow diagram of an example process for constructing contactors during construction of a module for a machine learning assembly.

FIG. 28 shows an example method 2800 of constructing contactors during construction of a module for a machine learning assembly. In the flow diagram, operations of the example method 2800 are shown as individual blocks.

At block 2802, at least one contactor is placed or formed on a substrate before folding the substrate into the housing of a module for a configurable machine learning assembly. Each contactor may be disposed near an edge of the substrate, to become a side and an interface of the module when the substrate is folded into a housing of the module. Each contactor provides physical and electrical contact between the module and another module or component of the configurable machine learning assembly, or between the module and a motherboard, a power connector, a data connector, a device, an appliance, or a computer, for example.

At block 2804, a compliant base, layer, or backing is provided for each contactor, the compliant base, layer, or backing for applying a contact pressure between a conductive element of the contactor and a conductive surface to be contacted by the contactor, such as a complementary pin or contact of a compatible interface for the module. The compliant base, layer, or backing may be a flexible material, a compressible material or mechanism, or a compressible air gap, for example.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific dimensions, quantities, material types, fabrication steps and the like can be different from those described above in alternative embodiments. The term "coupled" is used herein to express a direct connection as well as a connection through one or more intervening circuits or structures. The terms "example," "embodiment," and "implementation" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

The invention claimed is:

1. An apparatus, comprising:
a foldable substrate;
an element of a configurable machine learning assembly mounted or assembled on a first surface of a first portion of the foldable substrate; and
at least one connector formed on a second portion of the foldable substrate, the at least one connector configured to provide a physical contact, electrical contact, or both, the at least one connector formed on a second surface of the foldable substrate opposite the first surface,
wherein the foldable substrate folds into a housing and into an interface of a module of the configurable machine learning assembly, the first portion of the foldable substrate creating a bottom of the housing and the second portion of the foldable substrate with the at least one connector formed thereon creating a lateral side of the housing.

2. The apparatus of claim 1, further comprising a molding material to at least partially fill the module of the configurable machine learning assembly.

3. The apparatus of claim 2, wherein the molding material is attached to the foldable substrate and the molding material is mitered to be foldable with the foldable substrate.

4. The apparatus of claim 1, wherein the element of the configurable machine learning assembly comprises one of: a chip, a semiconductor, an integrated circuit, a metallic conductor, a discrete electronic component, a machine learning circuit, a machine learning core, a neural network, a sensor, a controller, an indicator, an output device, an actuator, an interface member, an adapter member, a connector, a processor, a memory element, a data storage medium, a battery, a driver, a transmitter, or a user interface.

5. The apparatus of claim 1, further comprising an opening in the housing of the module, the opening for exposing a MEMS element, an optical sensor, a sound sensor, an environmental sensor, or an actuator.

6. The apparatus of claim 1, wherein the connector is capable of providing physical and electrical contact between the module and one of: another module of the configurable machine learning assembly, a motherboard, a power connector, a data connector, a device, an appliance, or a computer.

7. The apparatus of claim 1, further comprising a compliant base, layer, or backing for each connector, the compliant base, layer, or backing to apply a contact pressure between a conductive element of the connector and a conductive surface to be contacted by the connector.

8. The apparatus of claim 7, wherein the compliant base, layer, or backing comprises one of a flexible material, a compressible material or mechanism, or a compressible air gap.

9. The apparatus of claim 1, further comprising a substrate foldable along multiple nonparallel fold lines to create a multisided module of the configurable machine learning assembly.

10. The apparatus of claim 1, further comprising a molding material to at least partially fill the module of the configurable machine learning assembly, wherein at least a portion of the molding material contacts the portion of the foldable substrate.

11. The apparatus of claim 1, wherein:
the first portion of the foldable substrate includes a horizontal plane of the foldable substrate; and
the second portion of the foldable substrate is folded to an approximate 90 degree angle with respect to the first portion of the foldable substrate.

12. The apparatus of claim 1, wherein:
the element is mounted or assembled on the first portion of the foldable substrate; and
the second portion of the foldable substrate is folded to an angle with respect to the first portion of the foldable substrate.

* * * * *